(12) United States Patent
Nakanishi et al.

(10) Patent No.: US 6,793,410 B2
(45) Date of Patent: Sep. 21, 2004

(54) OPTICAL COMMUNICATIONS MODULE

(75) Inventors: Hiromi Nakanishi, Osaka (JP); Takeshi Okada, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 32 days.

(21) Appl. No.: 10/316,721

(22) Filed: Dec. 11, 2002

(65) Prior Publication Data

US 2003/0123819 A1 Jul. 3, 2003

(30) Foreign Application Priority Data

Dec. 25, 2001 (JP) .................................. 2001-391143
Nov. 5, 2002 (JP) .................................. 2002-320705

(51) Int. Cl.[7] ................................................ G02B 6/36
(52) U.S. Cl. ........................... 385/92; 385/24; 385/88
(58) Field of Search ............................ 385/12, 15, 16, 385/24, 31, 39, 88, 92; 398/42, 43, 115, 146

(56) References Cited

U.S. PATENT DOCUMENTS

| | | | |
|---|---|---|---|
| 6,318,908 B1 * | 11/2001 | Nakanishi et al. | 385/89 |
| 6,435,734 B2 * | 8/2002 | Okada et al. | 385/88 |
| 6,603,782 B2 * | 8/2003 | Nakanishi et al. | 372/36 |
| 6,646,291 B2 * | 11/2003 | Takagi | 257/99 |
| 6,655,856 B2 * | 12/2003 | Nakanishi et al. | 385/94 |
| 2003/0231841 A1 * | 12/2003 | Nakanishi et al. | 385/92 |

FOREIGN PATENT DOCUMENTS

| | | |
|---|---|---|
| JP | 11068705 A | 9/1999 |
| JP | 11218651 | 10/1999 |

OTHER PUBLICATIONS

Masahiro Ogusu, Tazuko Tomioka, Shigeru Oshshima,"Receptacle Type Bidirectional WDM Module II", Proceeding of the 1996 Electronics Society Conference of IEICE, C–208, p208 (1996).

T. Uno, T. Nishikawa, M. Mitsuda, G. Tohmon, Y. Matsui, "Hybridly Integrated LD/PD Module with Passive–alignment Technology", Proceeding of the 1997 Electronics Society Conference of IEICE, C–3–89, p198 (1997).

* cited by examiner

Primary Examiner—Chau N. Nguyen
Assistant Examiner—Adolfo Nino
(74) Attorney, Agent, or Firm—Fish & Richardson P.C.

(57) ABSTRACT

For multichannel optical communications system, an optical communications module comprises a first story in a lower insulating case and a second story in an upper insulating case, allocating either story for an LD set having an optical connector, a silicon bench with lightwaveguides, a WDM (wavelength division multiplexer), LDs and an LD leadframe with leadpins, and the other story for a PD set having PDs and a PD leadframe with leadpins. Another optical communications module comprises a first story in a lower insulating case and a second story in an upper insulating case, allocating either story for an LD set having an optical connector, a silicon bench with lightwaveguides, a beamsplitter, LDs and an LD leadframe with leadpins, and the other story for a monitoring PD set having monitoring PDs and a PD leadframe with leadpins. The both stories are filled with a transparent resin and the both cases are molded with another hard resin.

52 Claims, 18 Drawing Sheets

Fig.1 Embodiment 1

Fig.2
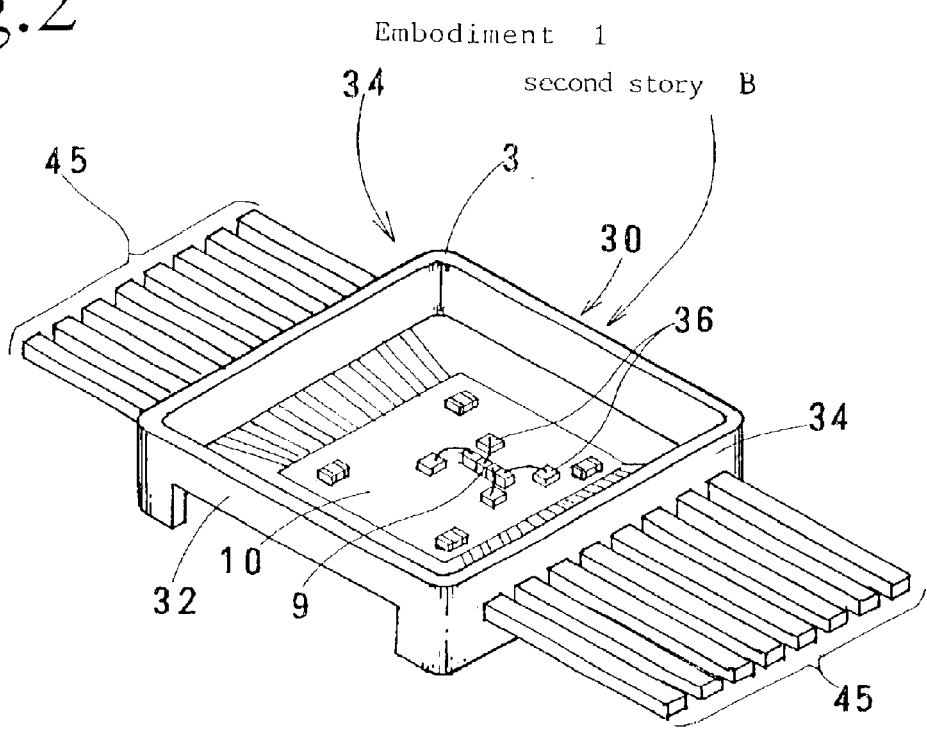
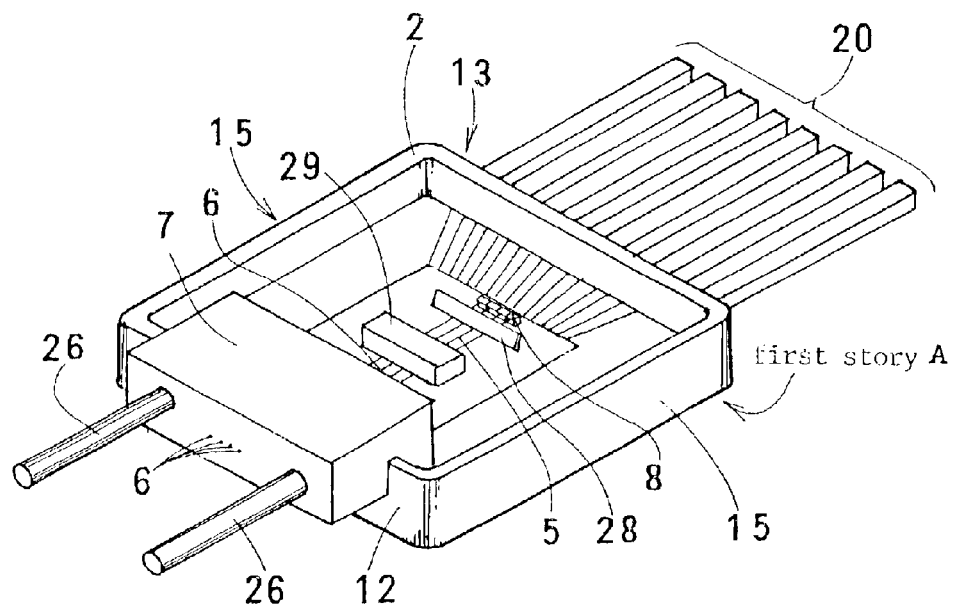

Embodiment 1

Embodiment 2

OPTICAL COMMUNICATIONS MODULE

BACKGROUND OF THE INVENTION

1. Field of the Invention

This invention relates to an optical communications module having M laser diodes (LDs), M photodiodes (PDs) and M lightwaveguides (M≧1) suitable for bi-directional simultaneous optical communications which allocate a single fiber to both upward and downward signal streams. This invention also relates to an optical communications module having M laser diodes (LDs), M monitoring photodiodes and M lightwaveguides (M≧1) suitable for optical communications which allocate a fiber to an upward signal stream.

This application claims the priority of Japanese Patent Applications No. 2001-391143 filed on Dec. 25, 2001 and No. 2002-320705 filed on Nov. 5, 2002, which are incorporated herein by reference.

Bidirectional communications gives an optical fiber a role of carrying optical signals in both directions between a central station and a plurality of subscribers (ONU: optical network units). LD/PD modules are equipped at the ONUs and the station. An LD/PD module should separate light paths into a PD part and an LD part at ends of optical nets. Various separation elements have been proposed. Requirements for the LD/PD path separation elements are low-division loss, low optical crosstalk, low electrical crosstalk, and low electromagnetic crosstalk.

Optical crosstalk means that strong light emitted from an LD goes into a highly sensitive PD and induces noise in receiving signals. Simultaneous bidirectional communications system uses two different wavelengths λ1 and λ2. λ1(1.3 μm) is a upward signal wavelength which is sent from ONUs to a central station. λ2(1.55 μm) is a downward signal wavelength which is sent from the central station to the ONUs. Photodiodes (PDs) generally used in optical communications have an InGaAs light receiving layer (sensing layer or active layer) which has sensitivity between 1.0 μm and 1.6 μm. The InGaAs-PDs sense both λ1 and λ2. Thus, optical crosstalk from LDs to PDs should be eliminated. "Optical" means that the medium of transmitting noise is light.

Another problem is electric crosstalk from LDs to PDs. Electric crosstalk means that strong driving currents for LDs mixe with weak photocurrents of PDs via a package or wirings. "Electric" means that the medium of transmitting noise is electric currents. A further problem is electromagnetic crosstalk. LDs generate electromagnetic waves which fly in space to the PDs and induce noise in the receiving signals. "Electromagnetic" means that the medium of carrying noise is electromagnetic waves. Reduction of optical, electrical and electromagnetic crosstalk is ardently required for LD/PD modules in the optical communications.

2. Description of Related Art

There are some types of modules for allocating an LD and a PD. FIG. 12 shows a discrete type of an LD/PD module. The discrete type LD/PD module aligns an optical fiber 85 and an LD 86 along a straight beam line, positions a Wavelength Division Multiplexer (WDM) 87 slanting by 45 degrees to the beam line at a middle point in the straight beam line, and disposes a PD 88 in a vertical direction which crosses the beam line at right angles. In the module, transmitting light signals emitted from the LD 86 simply pass the WDM 87 and go into the optical fiber 85. Receiving light signals propagating in the optical fiber 85 are reflected at the WDM 87 and are guided into the PD 88 for generating photocurrents which represent receiving signals.

The WDM 87 is employed for selecting wavelengths in the module. The WDM, which is an optical device made by piling a plurality of sets of more than two kinds of transparent dielectric thin films having different refractive indices, allows a first wavelength (λ1) to pass at a ratio of nearly 100% but reflects a second wavelength (λ2) at a rate of nearly 100%. The WDM has an intermediate rate of transparency and another intermediate rate of reflection for other wavelengths.

① Masahiro Ogusu, Tazuko Tomioka, Shigeru Ohshima, "Receptacle Type Bi-directional WDM Module I", Proceeding of the 1996 Electronics Society Conference of IEICE, C-208, p208 (1996).

The module proposed by ① has light paths in a free space. A PD and an LD form an independent PD module and an independent LD module which are separated in the free space. Spatial separation decreases crosstalk between the PD and the LD, which is an advantage. Since separated modules are integrated in the free space, the module is bulky, large, heavy and expensive.

Another known module divides an optical path by a Y branch coupler. The y-branch module is made by fabricating an inverse y-shaped branch lightwaveguide on a silicon bench, positioning a photodiode at an end of the lightwaveguide, providing a wavelength division multiplexer (WDM) at a branch point, putting a laser diode (LD) at an end of a right branched waveguide, and putting an end of an optical fiber at another end of a left branched lightwaveguide. The optical fiber emits 1.55 μm receiving signals to the left branched lightwaveguide. The 1.55 μm receiving signals make a straight way via the WDM in the lightwaveguide into the PD. The LD emits 1.3 μm transmitting signals. The 1.3 μm signals run in the lightwaveguide. The transmitting 1.3 μm signals are reflected by the WDM and go into the optical fiber.

② Japanese Patent Laying Open No.11-68705, "Two-way WDM Optical Transmission Reception Module", proposed such a Y-branched WDM based planar type module, in which receiving light going out from an optical fiber propagates in a lightwaveguide, passes the WDM and reaches a PD and transmitting light yielded by an LD is reflected by the WDM and enters the optical fiber. The LD and the PD are allocated at opposite ends of an silicon bench with a wide distance. ② asserted that such a structure decreases electric crosstalk and optical crosstalk.

The PD and the LD are mounted upon the common silicon bench. Silicon, which is a semiconductor with high conductivity, conducts electricity. Thus, electric crosstalk would be large. Silicon is transparent for 1.3 μm light. Thus, optical crosstalk would be large in the silicon bench based module. The planar Y-branch type module has another drawback that the LD and the PD mounted on the surface require wide areas on a silicon bench. It is difficult to modify the planar single LD/PD module into a multichannel module having a plurality of pairs of LDs and PDs.

A third type known module is an upward branch type which is prepared by making a linear lightwaveguide/linear optical fiber on a planar bench, disposing a laser diode (LD) at an end of the lightwaveguide/fiber, providing a upward slanting WDM in the lightwaveguide/fiber and positioning a photodiode on a submount put at a point slanting to the WDM on the bench. Receiving light propagating in an external fiber and going into the lightwaveguide is reflected by the WDM upward to the PD.

③ T. Uno, T. Nishikawa, M. Mitsuda, G. Tohmon, Y. Matsui, "Hybridly Integrated LD/PD Module with Passive-alignment Technology", Proceeding of the 1997 Electronics Society Conference of IEICE, C-3-89, p 198 (1997).

The above proposed such an upward branch type which was made by preparing a silicon bench having a lower front step and a higher rear step with a V-groove, gluing a glass substrate having a V-groove on the front step of the silicon bench with the V-groove aligning the bench V-groove, mounting an optical fiber on the V-grooves, installing a WDM in a slit at an intermediate spot of the fiber, mounting a photodiode on a submount at a point slantingly in front of the WDM, and fitting a laser diode at the end of the fiber. Receiving light running in the fiber is reflected upward by the WDM and is guided into the PD. Light passage is vertically divided for the LD and the PD.

Since the PD should be mounted slightly higher than the LD, the PD is mounted on the submount giving an additional height. An interval between the WDM and the PD is very short. Light path length between the WDM and the PD is small. The height difference of the PD and the LD is as small as a diameter of the optical fiber. Then, the PD and the LD are laid nearly on the same height.

④ Japanese Patent Laying Open No.11-218651, "Optical Transmission and Reception Module", proposed a module having a transmitting part separated vertically from a receiving part, which had been invented by the same inventor as the present invention. A ground metallize is sandwiched between the separated transmitting part and the receiving part. FIG. 13 denotes a vertical section of the proposed device for showing gluing parts. A first substrate 95 has a through-hole and a bottom ground plane G. The first substrate 95, which is allotted to be the transmitting part, has a lightwaveguide, a WDM 97 on the top surface and an LD 98. A second substrate 99 has a through-hole and the ground plane G on the top. The second substrate 99, which is allocated to be the receiving part, has a PD 102 at the bottom of the holes and an AMP 103 near the PD 102. The first substrate is glued to the second substrate at the ground plane G. An end of an optical fiber 105 is joined to an end of a lightwaveguide 96.

Transmitting light signals emitted from the LD go into the optical fiber via the WDM. Receiving light signals propagating in the optical fiber are reflected by the WDM downward, pass the holes and go into the PD. The intermediate ground metallize G is commonly connected both to the LD part and the PD part. The ground metallize G, which is just on the plane joining the PD part to the LD part, prevents LD electromagnetic noise from invading to the PD. The WDM separates the optical path into an upper path and a lower path. The PD is mounted on a spot distanced from the first substrate having the lightwaveguide. The intermediate ground metallize G inhibits electromagnetic noise from the LD from inducing noise in the PD. This was a sophisticated LD/PD module proposed by the same inventor as the present invention.

The inventors had invented the vertical type LD/PD module as an ONU module. Thus, the module contains only a single LD, a single PD, a single waveguide and a single fiber. The ONU module has no need for mounting a plurality of pairs of PDs and LDs. The ONU module need not save a space or a volume for mounting plural LDs and PDs. ④ turned out to have weak points yet. The intermediate ground metallize G, which was a gist of improvement of the module, has a tendency of transmitting LD noise to the PD by playing a role of antenna catching the LD electromagnetic noise and by fluctuating the ground level. The silicon substrates of the LD part and the PD part are coupled on the intermediate ground metallize G. A thin $SiO_2$ film acts as a capacitor which allows AC electric currents to pass therethrough. The silicon substrates conduct electric currents, which induce electric noise in the PD part. Silicon is transparent for the nearinfrared light of the LD. Thus, the proposed ④ was still incompetent to reduce crosstalk due to electric, electromagnetic and optical LD noise invasion to the PD via the silicon substrates and the ground metallize G.

There has been no requirement of multichannel LD/PD modules which contain a plurality of pairs of LDs and PDs so far. Many proposals have aimed at improvements of single-pair LD/PD modules containing only a single pair of LD and PD. Such a single-pair module does not invite a strong demand of reducing a unit size per an LD/PD pair. However, the multichannel LD/PD modules having a plurality of LD/PD pairs will be ardently required in near future. Unlike single-pair modules, reduction of a size per an LD/PD pair will be one of the most important problems for the multichannel LD/PD modules for preparing inexpensive, small-sized LD/PD modules.

Why does the new demand for the multichannel LD/PD modules occur? Bidirectional simultaneous communications send signals in an optical fiber in both directions simultaneously. Optical fibers join a plurality of ONUs (optical network units) to a single central station. N denotes the number of the ONUs. For communicating N ONUs, N optical fibers should be laid between the station and N ONUs. The present invention relates to an improvement of the bidirectional simultaneous optical communications. There are some alternatives for joining fibers.

At an early stage of building the optical communications, a 1:16 joint had been proposed. Sixteen ONUs (subscribers) are unified to a set. One main optical fiber is laid from the station for every set of the sixteen ONUs. The main optical fiber is divided into the sixteen ONUs by a 1:16 branch coupler which is laid near the sixteen ONUs. FIG. 14 shows the 1:16 joint system. The system is capable of reducing the number of fibers to N/16. The number of LD/PD modules installed in the station is N/16. The 1:16 joint has an advantage of sparing fibers and station modules. However, this system requires controlling the 1:16 branch coupler from the station and the ONUs. The additional controlling invites complexity of the 1:16 joint system and decreases flexibility for a change of ONUs.

At present, a simple 1:1 system (FIG. 15), which connects an ONU to a central station with a fiber without a branch coupler, has been examined instead of the 1:16 system. N optical fibers are laid between the single station and N ONUs. Although the 1:1 system requires longer fibers than the 1:16 system, the simple 1:1 system has an advantage of simple controlling and rich flexibility. However, the 1:1 system has another drawback of dilating required spaces and volumes for installing plenty of LD/PD modules at a central station in addition to a vast use of fibers.

In the 1:1 system, if the station employs LD/PD devices containing a plurality of LD/PD pairs in a unit, the number and the total volume of the units can be reduced. Employment of four LD/PD pair modules, eight LD/PD pair modules, sixteen LD/PD pair modules, . . . will reduce the number of the modules down to N/4, N/8, N/16, . . . at the station. For the reason, multichannel LD/PD modules are newly required as station modules.

One purpose of the present invention is to provide a small-sized multichannel optical communication device which contains a plurality of LD/PD pairs without increment of an installing space or volume. Another purpose of the present invention is to provide an inexpensive multichannel LD/PD module which is suitable for reducing cost per channel. A further purpose of the present invention is to provide a low-crosstalk multichannel LD/PD module which suppresses electromagnetic noise, electric noise and optical noise from transmitting from LDs to PDs. A further purpose of the present invention is to provide a small-sized multichannel optical communication device which contains a plurality of pairs of LDs yielding transmitting signals and PDs monitoring the LDs.

The present invention proposes a two-story module having a first story in a lower insulating case and a second story in an upper insulating case, allocating either story for an LD set having an optical connector, a silicon bench with lightwaveguides, a WDM(wavelength division multiplexer), LDs and an LD leadframe with leadpins, and the other story for a PD set having PDs and a PD leadframe with leadpins, filling the both stories with a transparent resin, and moulding the both cases with another hard resin. Every pair of an LD and a PD is contained in an imaginary plane vertical to a case base plane (case surface). The present invention features a vertical allotment of an LD and a partner PD, which alleviates a volume per LD/PD pair. Transmitting light beams emitted from the LDs propagate in the lightwaveguides on the silicon bench, pass the WDM without loss, go into optical fibers and propagate in the fibers to a counterpart node (a station or an ONU). Receiving light beams emitted from the optical fibers go into the lightwaveguides, propagate in the lightwaveguides, are reflected upward or downward by the WDM, fly slantingly in a resin-filled space, pass floor holes perforated on a bottom of the upper case, arrive at the PDs and make photocurrents carrying receiving signals. The PDs are shielded from the LDs by a bottom floor of the upper insulating, opaque case. The opaque upper case enables the module to suppress optical crosstalk between the LDs and the PDs.

Instead of a silicon case, an insulating case separates the PD part from the LD part, which reduces electric crosstalk via a case. An LD wiring part is entirely separated from a PD wiring part in the package, which reduces electrical crosstalk via wirings. Besides, no ground plate, which causes electromagnetic interference by fluctuation of a ground voltage, is interposed between the LD part and the PD part. Elimination of the ground metallize reduces electromagnetic crosstalk between the LD part and the PD part.

LDs or PDs are exclusively allotted to either the upper case (second floor) or the lower case (first floor). Allocation of PDs or LDs to the first floor or the second floor is optional. In both cases, the whole of the upper case and the lower case is molded into a body with a hard resin. The present invention allots the LD part including the lightwaveguides and the PD part separately to either the upper case or the lower case for guiding light signals in a vertical direction. A plurality sets of an LD, a lightwaveguide, a PD and an fiber can be arranged side by side in the horizontal direction vertical to the axial line, which alleviates the width and the volume of a device. The present invention is the most suitable for multichannel LD/PD modules.

This invention is applicable to a multichannel LD module having a plurality of pairs of LDs and monitoring PDs in addition to multichannel LD/PD modules. The teaching of the present invention gives a multichannel LD module by preparing an upper case and a lower case, allotting an optical connector, a lightwaveguide-formed silicon bench, a beamsplitter, LDs and LD leadpins to one of the two cases, allotting monitoring PDs and PD leadpins to the other of the two cases, unifying the lower case with the upper case, filling both cases with a transparent resin. LDs produce transmitting signal light beams. Parts of the LD produced light beams propagate in the lightwaveguides, pass the beamsplitter, and go into fibers on one floor. Other parts of the LD produced beams are reflected by the beamsplitter to the monitoring PDs which are mounted on the other floor. The PDs are not signal detecting PDs but LD power monitoring PDs.

PDs and LDs are installed in different floors. There are two probable versions. One is a set of a PD ground floor and an LD second floor. The other is a set of an LD ground floor and a PD second floor.

The PDs are not signal receiving PDs but monitoring PDs for checking a change of the power of LDs. Prevention of crosstalk is not a problem. M LDs and M PDs are allocated at vertically different positions. When it is difficult to mount monitoring PDs just at the back of LDs, the vertical allocation of LDs and PDs is useful. For example, it is sometimes desired that LD-driving ICs should be installed just behind the LDs. In usual, LD-driving ICs are provided in external circuits and the LDs and the LD-driving ICs are connected via leadpatterns, leadpins and Au wires. Long wirings between the LDs and the ICs distort signals through large inductance L of the wirings. The higher frequency the signal has, the more the signal distorts. High speed optical communications requires the LD modules to lay LD-driving ICs just behind the LDs for reducing signal distortion by shortening wirings. In the case, the LD-driving ICs are obstacles for placing monitoring PDs just behind the LDs. The present invention, which allocates LDs and monitoring PDs to different floors, is useful for making high speed LD modules having LDs connected with LD-driving ICs with short wires.

LD modules of a set of LDs and monitoring PDs take a similar structure to a set of LDs and signal-receiving PDs. Allocation of LDs or PDs to a first floor or a second floor is optional. It is preferable to fill unified cases with a transparent resin for decreasing random scattering and reflection.

The LD part with lightwaveguides and the monitoring PD part are separately allocated exclusively either to the upper floor or to the lower floor. The structure saves horizontal area. The present invention is suitable for multichannel LD modules since a plurality of LD/PD pairs can be arranged in parallel in a horizontal direction.

The present invention employs a two-story package with an upper case and a lower case and allocates either to a transmission portion and the other to a receiving portion. The transmission portion includes a fiber connector, a silicon bench with lightwaveguides, a WDM, LDs, LD leadpins and an LD wiring leadframe. The receiving portion includes PDs, AMPs, PD leadpins and a PD wiring leadframe (leadpins are a portion of the leadframe). The receiving light signals propagating in the fibers are reflected either upward or downward by the WDM. An inner space of the two-story package may be left to be an air-occupied space. Optionally, the inner space is filled with a transparent resin for reducing random scattering or reflection of light.

There are two types for allocating a PD part or an LD part to either a lower floor or an upper floor. One is an upper PD and a lower LD type and the other is an upper LD and a lower PD type.

[Upper PD/Lower LD Type]

A first story includes a transmitting part with LDs and a second story includes a receiving part. A lower case includes an optical connector having fibers and a silicon bench with M V-grooves, M lightwaveguides and M laser diodes (LDs) ($M \geq 1$). An upper case has M photodiodes (PDs) and optionally M preamplifiers (AMPs).

Allotment of higher PDs and lower LDs can be also applied to an LD module of two stories by displacing the signal detecting PDs by monitoring PDs. In the two story LD module, a lower case has a silicon bench with M lightwaveguides and M LDs, M fibers and an optical connector. An upper case has M monitoring PDs. Optionally auto-power controlling ICs closely accompany the monitoring PDs in the upper case.

[Upper LD/Lower PD Type]

A first story includes a receiving part with PDs and a second story includes a transmitting part with LDs. An upper case includes an optical connector having fibers and a silicon bench with M V-grooves, M lightwaveguides and M laser diodes (LDs) ($M \geq 1$). A lower case has M photodiodes (PDs) and optionally M preamplifiers (AMPs).

Allocation of lower PDs and higher LDs can be applied to an LD module of a two stories by displacing the signal detecting PDs by monitoring PDs. In the LD module case, the M monitoring PDs can be optionally accompanied by auto-power controlling ICs (APC-ICs) in the same lower case. The LD module has an upper case containing a silicon bench with M V-grooves and M lightwaveguides, M LDs, M fibers and an optical connector like the LD/PD module.

[Transparent Resin]

The upper case and the lower case are filled with a transparent resin without air gap for reducing reflection and random scattering at interfaces between the fibers and the space or between the lightwaveguides and the space. Requirements for the resin are transparency and a refractive index similar to the fiber (n=1.46). Similarity of the refractive indices reduces the reflection loss at the interface. For example, the resin is one of silicone resins or acrylate resins. In addition to the reduction of reflection loss, the resin has sufficient elasticity which protects PDs, LDs, AMPs and wires from external shock or force.

[Substrate]

An optimum material of a substrate for making lightwaveguides and LDs thereupon is silicon (as a silicon bench). Alternatives are ceramic substrates or polymer substrates.

[Case]

A upper case and a lower case can be made by insert-molding a resin and a leadframe in a metallic mould. The leadframe has leadpins and wiring patterns in a thin metallic plate. The insert-molding dispenses with the steps of printing metallized wiring patterns on an insulating substrate and sticking the insulating substrate into the cases. Liquid crystal polymer can be a resin of forming cases. Choice of liquid crystal polymer gives low-cost cases. Otherwise, ceramic cases are also available for the upper cases and the lower cases. In the case of the ceramic packages, metallized patterns should be made by printing, evaporating, sputtering and etching metals upon surfaces of the ceramic packages and leadpins should be brazed on peripheral wiring pads. Ceramic cases, which require higher cost than resin packages, excel in air-tightness, sealing, water-proof and life time. The following description relates mainly to metal-unified plastic cases insert-molded with leadframes.

[Lightwaveguide]

Lightwaveguides are made with quartz or polymers. Polymer waveguides, which can be easily fabricated upon resin substrates, can be low-cost lightwaveguides. In the case of silicon substrates, quartz waveguides are also available. A set of a silicon substrate and quartz lightwaveguides, which raises cost, has an advantage of low propagating loss.

[Number of LD/PD Pairs]

The present invention includes a single or a plurality of LD/PD units. "M" denotes the number of LD/PD units. An inequality $M \geq 1$ indicates the scope of the present invention. In any value of M, the present invention separates PDs from LDs by positioning LDs and PDs at different floors. The vertical allocation reduces the area occupied by LDs and PDs by arranging LD/PD effectively in a restricted space. The LD/PD modules of the present invention are preferable for multichannel optical communications devices. The present invention is also applicable to multichannel LD modules which contain a plurality of pairs of LDs and monitoring PDs. The LD module allocates LDs and monitoring PDs to different floors at different heights on a two-storied package.

An optical communications system connects a central station to a plurality of subscribers (ONU; optical network units) with optical fibers. $\lambda 1$ (e.g., 1.3 $\mu$m band) denotes a wavelength of upward signal light from ONUs to the central station. $\lambda 2$ (e.g., 1.55 $\mu$m band) denotes a wavelength of downward signal light from the central station to ONUs. "N" designates the number of ONUs. An ONU module, which should have a single transmitting device and a single receiving device, is a single pair module of M=1. At an ONU, upward $\lambda 1$ is the transmitting signal light which should be generated by an LD and downward $\lambda 2$ is the receiving signal light which should be sensed by a PD. N ONUs require N single LD/PD modules.

At the central station, the relation of the wavelengths is reversed. Downward $\lambda 2$ are transmitting light signals which are produced by LDs at the station. Upward $\lambda 1$ are receiving light signals which are sent from ONUs and are detected by PDs at the station. Instead of the sixteen branch network, which is annoyed at a complex relay element-controlling system, as shown in FIG. 14, a non-branch 1:1 fiber network which connects a station to N-ONUs with N independent fibers is now a prevailing candidate (shown in FIG. 15). If the communication system employs the non-branch network, the station requires N LDs and N PDs for N ONUs. If the station takes a single channel LD/PD module (M=1), N LD/PD modules should be equipped at the station, which occupies a huge volume in the station. If the station adopts four channel LD/PD modules (M=4), N/4 LD/PD modules are enough for the station.

Furthermore, use of eight channel LD/PD modules (M=8) enables the station to reduce the number of modules to N/8. N/16 sixteen channel LD/PD modules satisfy the requirement of the station. The reduction of the number of the modules is favorable for the central station having a poor extra space for storing the modules. The consideration clarifies that multichannel modules are preferable for the station.

Many proposals have been suggested for single-channel LD/PD modules. But, little multichannel devices have been suggested hitherto. Multichannel LD/PD modules which dispense with a wide space will be strongly required in future. The present invention is preferable for the requirement of multichannel devices.

[Leadframe]

Both the upper case and the lower case are resin cases transfermolded with leadframes. The PDs are not laid upon the silicon bench but upon the leadframes. The receiving signal light beams, which are reflected slantingly by the WDM midway on the waveguide, pass bottom holes and enter counterpart photodiodes. The bottom holes are not perforated on the silicon bench but on the metallic thin leadframe. The bottom holes, which are made at a stroke with other wiring parts by punching thin metal plates, require no extra step of perforating. The cited references ④ (Japanese Patent Laying Open No. 11-218651) includes the step of mechanically drilling penetrating holes on a silicon bench. It takes long time to drill holes on a rigid silicon bench. This invention, which needs not perforated holes on a silicon bench, is superior to ④ in perforating holes.

[Optical Crosstalk]

This invention enables the LD/PD device chips to reduce a volume per a unit LD/PD. In addition to the reduction of the volume per a unit, the present invention excels in alleviating optical crosstalk and electrical crosstalk between PDs and LDs. The two-story structure of the package allows the present invention to allocate LDs to a first floor or a second floor and to allocate PDs to the other floor. A thick bottom floor separates PDs from LDs. The bottom plate of the upper case suppresses optical crosstalk by shielding the PDs from the light emitted from the LDs. Silicon, which has a narrow band gap, allows light of a wavelength from 1 μm to 1.6 μm to pass through. Inherently, Si-benches, which are transparent to the near-infrared wavelengths (1 μm to 1.6 μm), are impotent for prohibiting optical crosstalk. The present invention shields noise light from LDs by the leadframes and the opaque resin (e.g., epoxy).

[Electrical Crosstalk]

The present invention separates PDs from LDs in a vertical direction as well as in horizontal directions. An insulating resin package intervenes between LDs and PDs. The related reference ④(Japanese Patent Laying Open No.11-218651) separates PDs from LDs with silicon bench. Silicon leads electricity. ④ is annoyed at large electrical crosstalk via the silicon bench. The present invention, which separates PDs from LDs by a resin package instead of silicon, succeeds in suppressing electrical crosstalk.

[Electromagnetic Crosstalk]

The PDs are distanced in both vertical and horizontal directions from the LDs which are strong sources of electric, electromagnetic and optical noise for the PDs. The grounds and wirings of the PDs are all separated from the grounds and wirings of the LDs by the cases. Separation of the wirings and grounds reduces electromagnetic crosstalk.

The prior reference ④ (Japanese Patent Laying Open No.11-218651) proposed an LD/PD module which was made by mounting an LD upon a first silicon bench, forming a ground metallize on a bottom of the first silicon bench, mounting a PD upon a second silicon bench, gluing the bottom of the second PD silicon bench to the bottom of the ground metallized bottom of the first LD silicon bench.

The intermediate ground (earth terminal) was a common ground both for the LD and the PD. The ground metallize would inhibit electromagnetic waves from flying from the LD to the PD.

The fact was otherwise. The thin metallized common ground, which was connected to an external ground via big resistance, was not a rigid ground. The thin metallize acts as an antenna, which catches electromagnetic waves from the LD, instead of the ground. The level of the metallize fluctuates by a varying LD level. Signal levels of the PDs and the AMPs are also varied by the fluctuation of the ground level. The wide, thin intermediate ground metallize turned out to be not effective but harmful for reducing electromagnetic crosstalk.

The present invention excludes a wide intermediate common ground between the PD part and the LD part. Since the effective antenna is eliminated, the PDs are insensitive to electromagnetic noise from the LDs. The wirings of the LDs are independent of and separated from the wirings of the PDs, because two leadframes are allocated exclusively to the PDs or the LDs in the upper or lower cases.

SUMMARY OF THE INVENTION

The present invention proposes optical communication modules of two-storied packages which allocate PDs and LDs to different stories. The PDs are separated from the LDs in a vertical direction in addition to horizontal directions. Vertical separation of PDs from LDs reduces electric crosstalk, electromagnetic crosstalk and optical crosstalk. Vertical allotment of PDs and LDs enables this invention to reduce chip occupation areas in comparison to the conventional modules having PDs and LDs on the same plane in a case. The effect of size-reduction is conspicuous, in particular, in the case of containing a plurality of sets of PDs and LDs (M=4, 8, 16 . . . ). The present invention is promising as a multichannel optical communication tool.

When a central stem station is connected to N ONUs (optical network units; subscribers) with N optical fibers without branch, a simple LD/PD module having a single pair of PD and LD is sufficient for each ONU. The stem station would require N LD/PD modules, if the station makes use of single pair LD/PD modules. N modules would take a vast volume for storing the modules in the stem station, which would enhance the cost of optical communications.

Use of a module of four pairs of LDs and PDs of the present invention alleviates the number of the modules installed in the station down to one fourth (N/4) of the number N of ONUs. Furthermore, employment of sixteen pair LD/PD modules of the present invention can reduce the number of LD/PD modules to one sixteenth (N/16) of N at the station. The present invention allows the stations to alleviate the space for modules by decreasing the number of modules. The present invention is suitable for the LD/PD modules at stations.

The relation of the transmitting/receiving signals λ1 and λ2 is inverse for the station module and the ONU modules. An optical communication system sends λ2 (1.55 μm band) signals from a central station to ONUs and sends λ1 (1.3 μm band) signals from the ONUs to the station. ONU modules have an LD for making λ1 transmitting signals and a PD for detecting λ2 receiving signals.

In this case, the multichannel module at the station should have LDs producing λ2 (1.55 μm band) transmitting signals and PDs for catching λ1(1.3 μm band) signals. A WDM at the station has wavelength selectivity of allowing λ2 to pass and reflecting λ1. FIG. 1 and FIG. 7 show such a case.

The WDM filter plays a wavelength-selective role of reflecting all the receiving beams from the optical fibers toward the upper case PDs or the lower case PDs and allowing all the transmitting beams from the LDs to pass therethrough.

Station LD/PD modules should have four, eight, sixteen pairs of LDs and PDs (M=4, 8, 16 . . . ) for reducing the space for storing the LD/PD modules. When LDs and waveguides are arranged with a 0.25 mm pitch on a silicon bench, sixteen LDs, for example, require a width of 0.25 mm×16=4 mm. An increase of required width in comparison to a single pair module is small for a sixteen-pair module or an eight-pair module. This invention gives small sized multichannel LD/PD modules (M=4, 8, 16, 32, 64 . . . ) having the same size or a similar size of packages.

Of course this invention can be applied to ONU modules having a single pair of LD and PD (Embodiment 3). An ONU LD/PD module should have λ1 (1.3 μm band) transmitting signals made by an LD and λ2 (1.55 μm band) receiving signals for being caught by a PD. An ONU WDM filter should allow λ1 to pass and reflect λ2.

The present invention can be applied to an LD module without signal detecting PDs. Laser diodes (LDs) degrade year by year. Laser power attenuates by the degradation. Preferably photodiodes should be provided in the vicinity of the LDs for monitoring the output power of the laser diodes. In the case of multichannel LD modules, it is difficult to arrange PDs just behind the LDs. Sometimes LD-driving ICs are installed just behind the object LDs, because long wiring distances between the LD-driving ICs and the LDs would distort the LD signal shapes.

The present invention allocates a set of LDs and another set of monitoring PDs exclusively either to the first floor or to the second floor for guiding parts of the LD beams reflected by the beamsplitter into the monitoring PDs. The beamsplitter, which has no wavelength selectivity, reflects parts of the LD transmitting beams and introduces the rest of the beams to the monitoring PDs on the lower floor or on the upper floor. The monitoring PDs detect the power of the LDs. The photocurrents of the monitoring PDs are input to the APCICs for controlling the power of the LDs at a constant level. There have been many LD modules having an LD which emits forward light and backward light, an optical fiber which sends the forward emitted LD light as transmitting signals, and a PD which detects the backward emitted LD light behind the LD. There has been no LD module in which a monitoring PD detects forward LD light. In the case of multichannel LD modules, which have poor margins behind LDs, vertical allocation of LDs and PDs of the present invention is advantageous.

BRIEF DESCRIPTION OF THE DRAWINGS

FIG. 2 is a perspective view of Embodiment 1 in a pre-coupling, dissembled state having the PD upper case and the LD lower case.

DETAILED DESCRIPTION OF THE PREFERRED EMBODIMENTS

Figure 1:
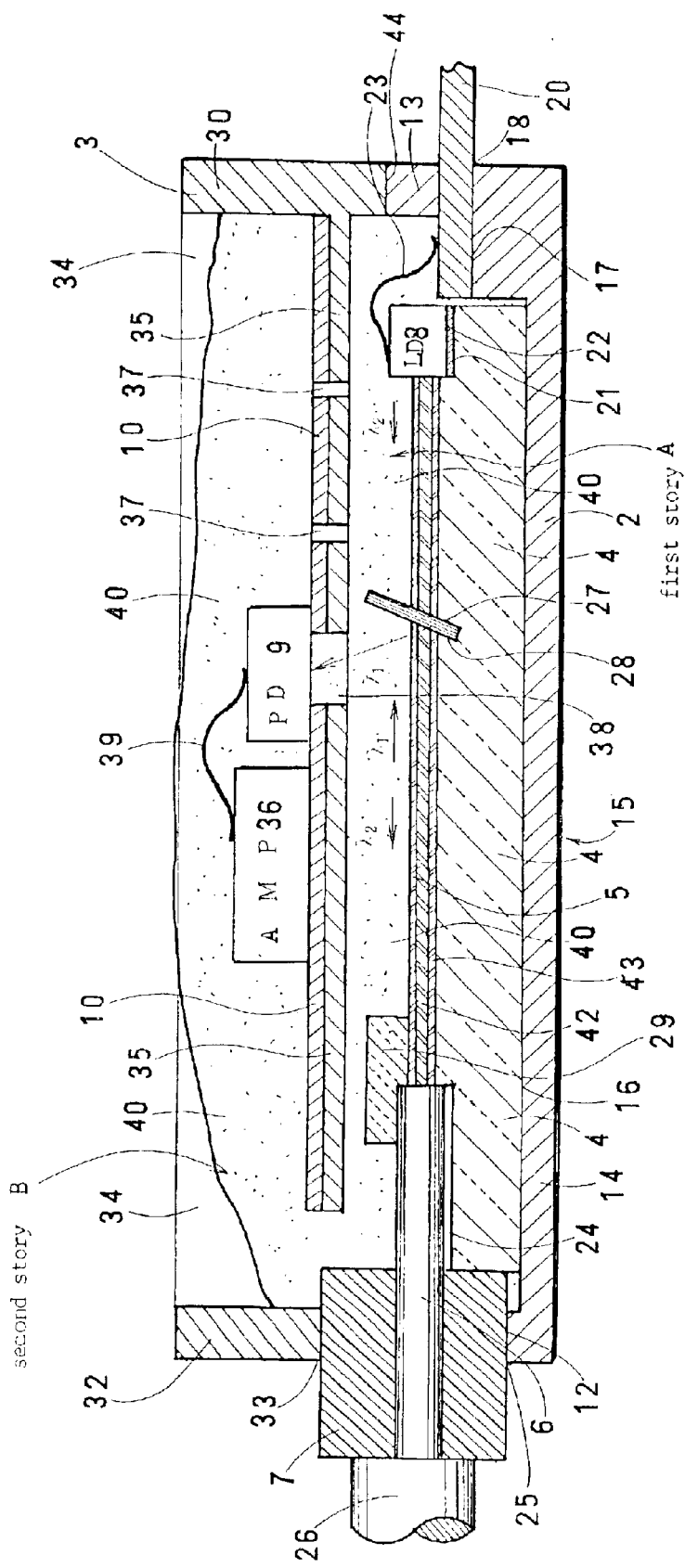
FIG. 1 is a vertically sectioned side view of an optical communications module as Embodiment 1 having an upper case with PDs and a lower case with LDs and lightwaveguides before transfermolding.

[Embodiment 1 (Lower LDs, Upper PDs: FIG. 1)]

FIG. 1 shows Embodiment 1 of an LD/PD module allocating lightwaveguides and LDs in a lower case and PDs in an upper case. The package contains two-story cases consisting of an upper case 3 and a lower case 2. FIG. 2 is a perspective view of the upper case 3 and the lower case 2 of Embodiment 1 before integration. FIG. 1, which is a section of the coupled cases, exaggerates the vertical size for clarifying the two-story structure.

The lower case 2 is allocated to a transmitting portion having lightwaveguides and LDs. The lower case 2 contains a silicon bench 4 which is a rectangular silicon single crystal plank. The silicon bench 4 has lightwaveguides 5 on an upper surface. The lightwaveguides are made from a fluoric polyimide. The lightwaveguides have a cladding/core/cladding structure which has been produced by selectively doping with a dopant changing a refractive index. Resin lightwaveguides are inexpensive and facile to produce.

Of course, it is possible to make $SiO_2$ lightwaveguides by oxidizing a surface of a silicon substrate and doping selectively with a dopant changing a refractive index of $SiO_2$ for making a cladding/core/cladding structure. Dielectric lightwaveguides, which are endowed with an advantage of low loss, requires complex fabrication steps which raise the cost. Since FIG. 1, a vertical section, shows only a single lightwaveguide, one, four, eight, sixteen, . . . lightwaveguides 5 are fabricated on the bench in practice. FIG. 2 denotes an example of M=4.

Optical fibers 6 are joined to front ends of the lightwaveguides formed on the silicon bench. The optical fibers 6 are sustained by an optical connector (MT connector) 7 in parallel in a horizontal direction. The number of the optical fibers 6 is M which is equal to the number of the lightwaveguides 5. LDs 8 are mounted at the back ends of the lightwaveguides 5 on metallized pads 22 printed on the silicon bench 4. A first floor in the lower case 2 requires a silicon bench for aligning the LDs 8, lightwaveguides 5 and fibers 6 along straight lines exactly.

The lower case 2 is a resin-made rectangular vessel with an open top. The lower case has a front wall 12, a back wall 13, a bottom plate 14 and side walls 15. A silicon bench 4 is fitted in a cavity 16 of the lower case 2. Leadpins 20 for the LDs, which pierce the back wall 13, are fitted on a rear step 17 of the lower case. In practice, the lower case is insert-molded with a resin and a thin plate leadframe. FIG. 1, which exaggerates parts in the vertical direction, depicts thick lightwaveguides which are actually thin enough, for clarifying the triplet cladding/core/cladding structure. Cores of the fibers, the cores of the lightwaveguides and emission stripes of the LDs align at the same height. The LDs are upside down fixed upon the metallize 22 on a lower step 21 for levelling the LD stripes with the cores of the lightwaveguides. Bottom electrodes (anodes) of the LDs are bonded on the metallize 22. Top electrodes (cathodes) of the LDs are wirebonded with the leadpins 20 by wires 23.

In the case of mounting a plurality of LDs, three types of LD wirings are allowable. A first type is a double-separated type having M independent cathode wirings and M independent anode wirings. A second type is a common-cathode type having M independent anode wirings and a common cathode wiring. A third type is a common-anode type having a common anode and M independent cathode wirings. LDs should be mounted either upside down or upside up in accordance with the wiring type. In this embodiment, LDs are upside down bonded with bottom p-electrodes upon the silicon bench and anodes are commonly gathered to a source pattern. Independent cathodes (on the tops) are wired to the isolated leadpins 20 by the wires 23. Examples of wirings of LDs and PDs are described later.

M V-grooves 24 are formed on a forward portion of the silicon bench 4. The V-grooves are made by making the best use of anisotropic etching of silicon single crystal. The silicon crystal structure gives the V-grooves a definite inclination angle of 54.7 degrees. The optical connector 7 holds parallel M optical fibers 6 aligning on a horizontal plane with a definite period. The optical connector 7 has a square shape, which has a length, a width nearly equal to the length, and a small thickness.

FIG. 1 takes an anisotropic scale which exaggerates matters in the vertical direction for clarifying the vertical structure. The optical fibers and connectors seem to have a large height in FIG. 1. But, the heights of the fibers and connectors are small in reality.

When another external connector having another set of fibers is joined to the optical connector 7, the external fibers are connected to the lightwaveguides 5 and the LDs 8 at the end. A slanting groove 27 is formed at an intermediate length of the lightwaveguide 5 on the substrate. A wavelength selective WDM filter 28 is inserted and fixed in the slanting groove 27. The WDM 28 has wavelength selectivity of allowing λ2 emitted from the LD 8 to pass but reflecting λ1 emitted from the fiber 6 upward at a definite angle. The WDM is a filter having desired reflection/transmission selectivity. The dielectric multilayered WDM is made by piling in turn many pairs of two kinds of transparent dielectric films with different refractive indices and different thicknesses.

Figure 18:
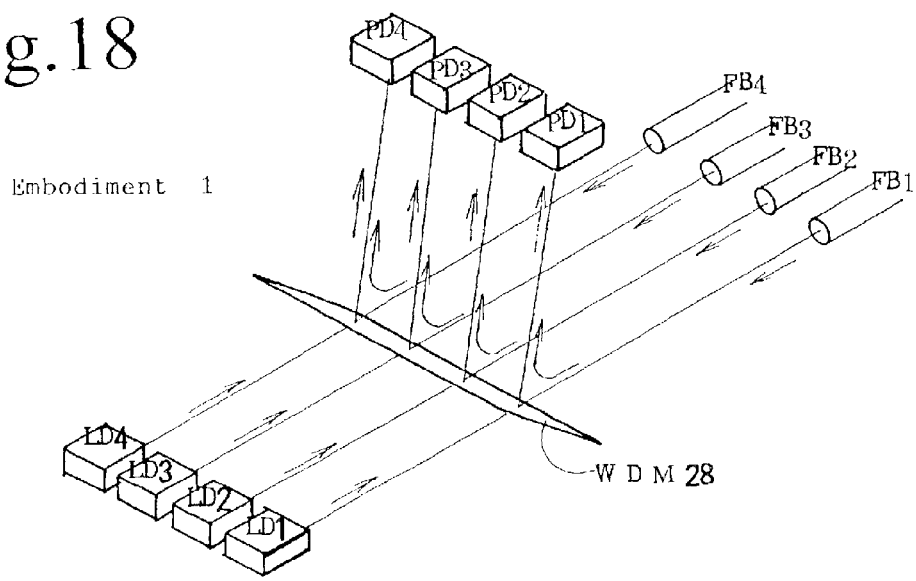
FIG. 18 is a schematic perspective view of Embodiment 1 for clarifying light paths being branched by a WDM and joining fibers, PDs and LDs. The upward slanting WDM reflects beams from the fibers upward to the PDs and allows LD beams to pass through to the fibers.

Wavelength selectivity of the WDM filter 28 is demonstrated by FIG. 18, which denotes a case of M=4. Embodiment 1 which allocates signal receiving PDs on the upper case installs the WDM filter 28 upward slantingly in the beams. Signal beams emitted from fibers FB1 to FB4 are reflected upward by the wavelength selectivity of the WDM 28 and are guided into bottom openings of the PDs. Transmitting beams emanating from LDs (LD1 to LD4) pass the WDM by the wavelength selectivity, go into the optical fibers and propagate in external fibers.

A second story B upon the upper case is described. The upper case 3 is a rectangle vessel having a rear wall 30, a front wall 32, side walls 34 and a bottom floor 35. A connector hole 33 is perforated in an axial direction at the front wall 32. The bottom floor 35 has wiring portions of a leadframe 10, which has been unified to the upper case by insert-molding. The upper case 3 is made of a resin, for example, a liquid crystal polymer. Though the bottom floor 35 integrated with the leadframe 10 actually has a complex structure, FIG. 1 depicts the bottom floor as a simple plank in brief. The leadframe 10, which has been made by punching a thin metallic plate with a patterned punch, has many branched, curved wiring patterns, wiring pads and leadpins. The bottom floor 35 with the leadframe 10 has several resin passing holes 37 through which a transparent resin 40 fluid flows from the second story B to the ground story A, when the transparent resin 40 is supplied to the second floor.

A floor hole 38 is perforated at a point on the bottom floor 35 slantingly above the WDM filter 28. The floor hole 38 is formed on the leadframe at a stroke with other wiring patterns by the punch. It takes no extra time to make the floor hole. PDs(photodiodes) 9 and AMPs (preamplifiers) 36 are mounted upon the leadframe 10 on the bottom floor. Leadpins building a portion of the leadframe 10 extend in side directions. An LD leadframe having leadpins extending sidewards is unified to the upper case by insert-molding. A PD leadframe having leadpins extending backward is unified to the lower case by insert-molding. The LD leadframe and the PD leadframe have different heights.

The PDs are reversely-biased by connecting cathodes (n-electrodes; bottom electrodes) to plus terminals of a power source and connecting anodes (p-electrodes; top electrodes) to input pads of the AMPs 36 by wires 39. Photocurrent is output from the anodes and is amplified by the AMPs 36.

The upper case 3 is coupled to the lower case 2 by piling the upper case 3 on the lower case 2 and gluing the cases at a joint portion 44. The fiber connector 7 is sandwiched between a connector hole 25 of the lower case 2 and the connector hole 33 of the upper case 3. The transparent resin 40 with a low refractive index similar to the fiber is supplied to the upper case 3. The transparent resin is, for example, a silicone type thermohardening resin or ultraviolethardening resin or an acrylate type thermohardening resin or ultraviolethardening resin. The resin fluid fills the upper floor (second story B), passes the resin holes 37 of the upper floor (second story B) and fills the lower case. The transparent resin 40 comes into tight contact with the lightwaveguides 5, LDs 8, wires 23, wiring patterns and leadpins 20.

The transparent resin 40 is a resin which is hardened either by heating or by ultravioletray irradiation. A hardened resin 40 has a refractive index (1.4 to 1.5) nearly equal to that of the optical fiber (quartz glass). A similar refractive index enables the transparent resin to reduce reflection attenuation loss at the end of the optical fiber.

A series of the abovementioned steps have made a two-story device having the upper case and the lower case. The upper case 3 and the lower case 2 are encapsulated by transfermolding with another resin. The resin for molding should be an opaque, rigid, sturdy and water-proof resin, since the resin is a package. For example, an epoxy resin is suitable for the package resin.

Figure 4:
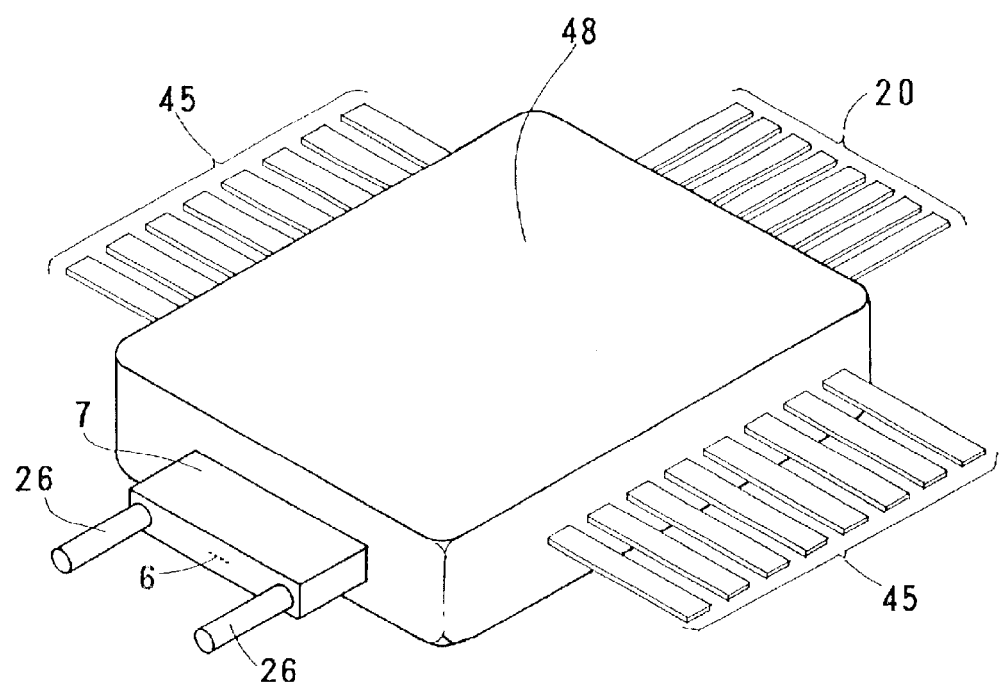
FIG. 4 is a perspective view of a completed module of embodiments of the present invention having projecting guidepins and extending leadpins.

FIG. 4 is a perspective view of a packaged optical communication device. A resin package 48 encapsulates the whole of the device. A series of the lead pins 20 for LDs projects backward. The LD leadpins 20 are parts of the leadframe for LDs in the first (lower) story A. Two series of leadpins 45 for PDs protrude from both sides. The side leadpins 45 are parts of the PD leadframe in the second (upper) story B.

A front end of the package has the optical connector 7 projecting forward. Ends of the optical fibers 6 appear on the front end of the optical connector 7. Two guide pins 26 protrude from the end of the optical connector 7. The guide pins 26 enable the device to couple with another connector. The length of the device is 10 mm. The width is 8 mm. The thickness is 4.5 mm. The pitch of the optical fibers is 0.25 mm (250 $\mu$m). Since four fibers are maintained in the connector 7, a total width of fibers is 250 $\mu$m×3+125 $\mu$m=875 $\mu$m.

Figure 3:
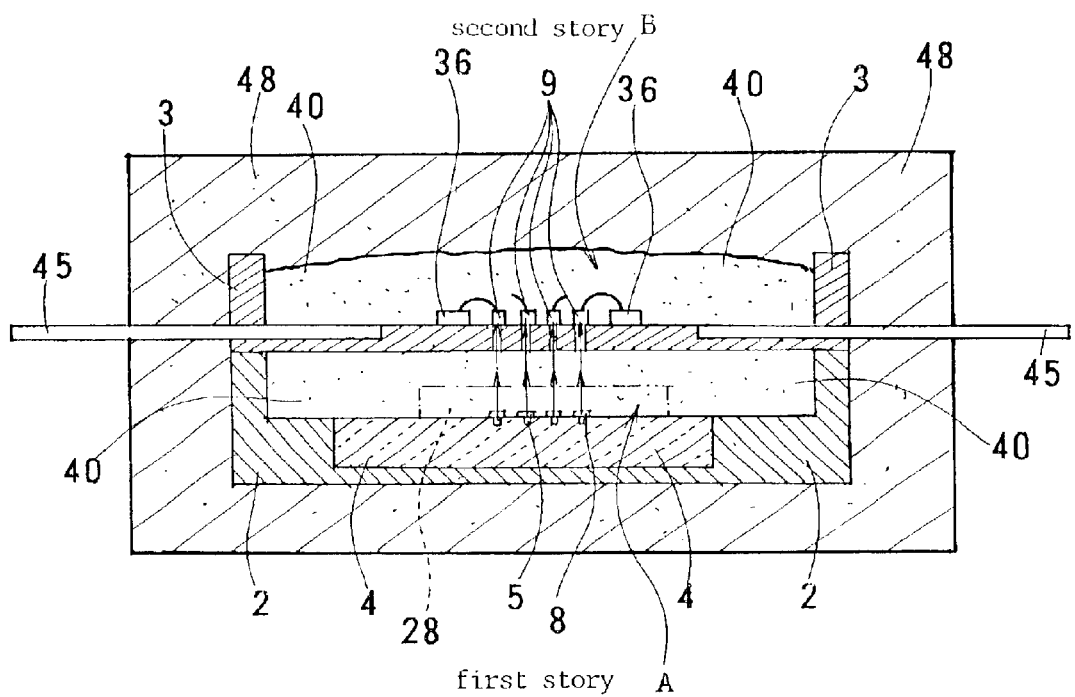
FIG. 3 is a vertically sectioned front view of Embodiment 1 which is completed by coupling the upper case with the PDs with the lower case with the LDs and the lightwaveguides and being transfermolded with a resin.

FIG. 3 is a sectional view of the same device taken along a line vertical to the waveguides. The vertical section shows four equivalent photodiodes (PDs) 9 aligning in parallel on the second (upper) floor B and four waveguides 5 running in parallel on the first (lower) floor A. This is an example of containing four sets of LD/PD (M=4). The leadpins 45 of the PDs 9 extend toward both sides. The leadpins 20 of the LDs 8 protrude backward. Difference of the extending directions of the leadpins 45 and 20 reduces electric crosstalk.

Besides the extending directions, two sets of the leadpins 45 and 20 are implanted at different levels on the sides and on the end. The level difference alleviates electromagnet coupling. An inner wiring of the PDs is fully separated from an inner wiring of the LDs. The PD wiring has a unique ground (the earth level). The LD wiring has another separated ground. Since two grounds are separated, the PD ground is not perturbed by the fluctuation of the LD grounds, which decreases electric crosstalk.

Figure 5:
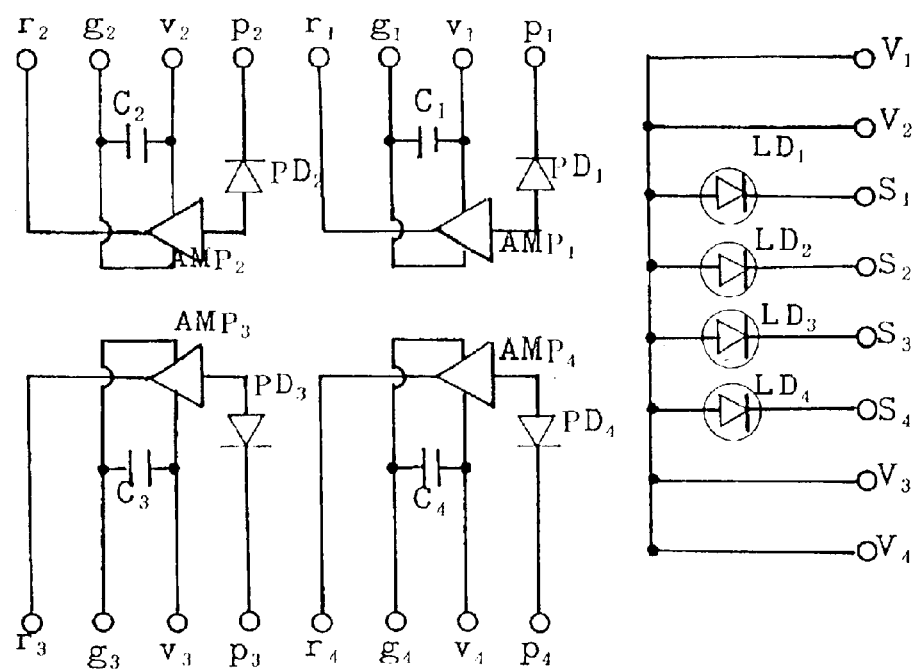
FIG. 5 is a wiring diagram of four sets of PDs, AMPs, LDs and leadpins in Embodiments 1 and 2.

FIG. 5 demonstrates an example of an electric circuit for coupling the optoelectronic chips (LDs and PDs) with amplifiers and leadpins. Eight leadpins are provided for four LDs. Eight leadpins are enough to give a cathode pin and an anode pin for each LD, which is a possible version. But, the example anodes of the LDs are commonly connected to one line. The common anode is coupled to a source voltage.

The LDs have independent cathodes to the contrary. The cathodes of $LD_1$, $LD_2$, $LD_3$ and $LD_4$ are connected to sending signal terminals $S_1$, $S_2$, $S_3$ and $S_4$. Such a cathode wiring is realized by epi-down (upside down) mounting the LD chips upon a common metallized pattern. There are extra four leadpins. The extra leadpins are all assigned to source pins $V_1$, $V_2$, $V_3$ and $V_4$. Of course, one or two source pins are also possible. In the case, extra leadpins should be vacant pins. The driving circuit has four independent sending systems (LDs). The sending signals $S_1$, $S_2$, $S_3$ and $S_4$ independently drive respective laser diodes. The LD wiring is formed to the leadframe provided upon the first floor.

The source and the ground of the LDs (sending system) are separated from the source and the ground of the PDs (receiving system). A PD circuit has sixteen leadpins. A common ground or a common source is available. But, an example employs separated, independent grounds and sources for four PDs.

A cathode of the $PD_1$ is connected to a leadpin $p_1$ by a PD wiring. An anode of $PD_1$ is connected by the wire 39 to an input of a preamplifier $AMP_1$, which also appears in FIG. 1.

A source pad of the AMP, is connected to a leadpin $v_1$ by a PD wiring. A ground pad of the $AMP_1$ is connected to a leadpin $g_1$ by a PD wiring. An output pad of the $AMP_1$ is connected to a leadpin $r_1$. A capacitor C, intervenes between the source line and the ground line. Connections of the $PD_2$, $PD_3$ and $PD_4$ to leadpins are similar to the mentioned connection of the $PD_1$. These wirings are assigned to the leadframe on the second (upper) floor.

Such a circuit can isolate and separate four PD wirings. Besides independent chips, the circuit can entirely isolate and separate the receiving system (PDs) from the sending system (LDs). The grounds and the sources are separated. Isolation and separation reduce electric crosstalk between the LD circuit and the PD circuit. Two grounds are unified via a long wiring into one level of an outer ground of an outer circuit. But, the long wiring prohibits fluctuation of the LD ground level from perturbing the PD ground level. The above is a solution of the problem of the LD/PD crosstalk.

Figure 6:
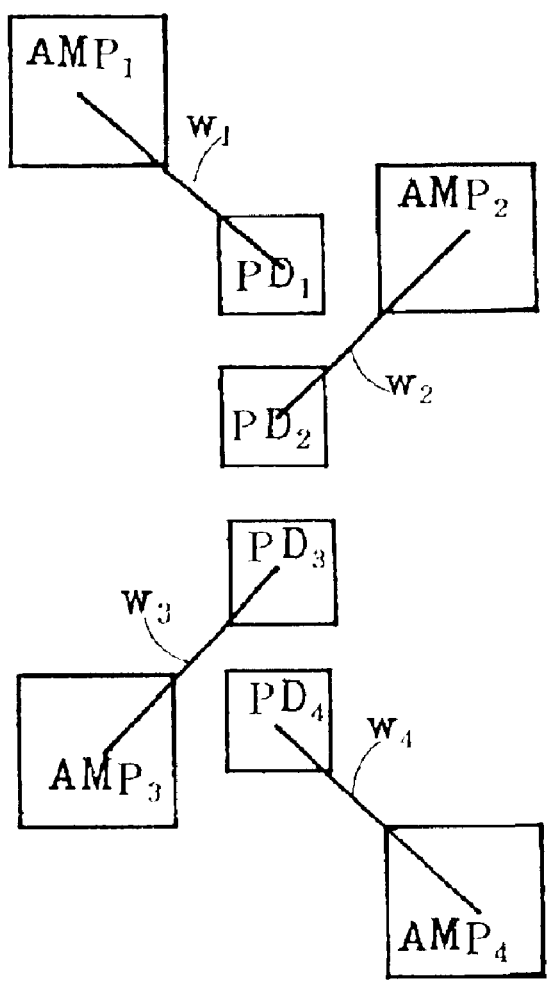
FIG. 6 is a partial plan view of an allocation and wirebondings among four sets of PDs and AMPs.

Another problem is PD/PD crosstalk. The wires connecting the $PD_1$, $PD_2$,$PD_3$ and $PD_4$ to the $AMP_1$, $AMP_2$, $AMP_3$ and $AMP_4$ respectively emit electromagnetic waves. If PDs connecting wires catch the electromagnetic waves from other wires, electromagnetic crosstalk occurs among the PDs. The wire plays a role of an antenna causing mutual crosstalk. The wires are directed vertical to a neighboring wire for depressing the crosstalk. FIG. 6 shows a set of wires connecting PDs and AMPs.

$PD_1$ to $PD_4$ align along a line in a definite interval. $AMP_1$ to $AMP_4$ are not arranged on a line. The $AMP_1$ lies at a left front point of the $PD_1$. A wire $w_1$ between the $AMP_1$ and $PD_1$ extends left-forward from the $PD_1$. The $AMP_2$ lies at a right front point of the $PD_2$. A wire $w_2$ between the $AMP_2$ and the $PD_2$ extends right-forward from the $PD_2$. Then, the $w_1$ is perpendicular to the $w_2$. The $AMP_3$ is at a left rear point of the $PD_3$. The $AMP_4$ lies at a right rear point of the $PD_4$. Similarly $w_3$ is vertical to $w_4$.

Displacement of the $AMP_3$ and the $AMP_4$ by a single pitch upward from the disposition of FIG. 6 allows the $w_2$ to meet at right angles to the wire $w_3$. The wire generates electromagnetic waves as an antenna. When two wires are orthogonal, one wire is insensitive to the electromagnetic waves flying from the other wire. Namely, the orthogonal disposition weakens electromagnetic coupling between the wires. In the example, the optical fibers align in parallel with a pitch of 250 $\mu$m. Thus, the pitches of the aligning PDs and LDs are also 250 $\mu$m. Individual, independent PDs of a 250 $\mu$m square can be employed for an aligning set of photodetectors.

Alternatively, a photodiode array of a size of 250 $\mu$m×1000 $\mu$m including four PDs can be employed for the photodetector. In this case, a common cathode can be formed to a whole bottom of the photodiode array, which enables the module to reduce the number of lead pins. Crosstalk among individual PD parts is reduced by forming separated cathode electrodes to the bottom of the individual parts of the PD array and connecting the separated cathodes to source pins $p_1$, $p_2$, $p_3$ and $p_4$ respectively.

Figure 7:
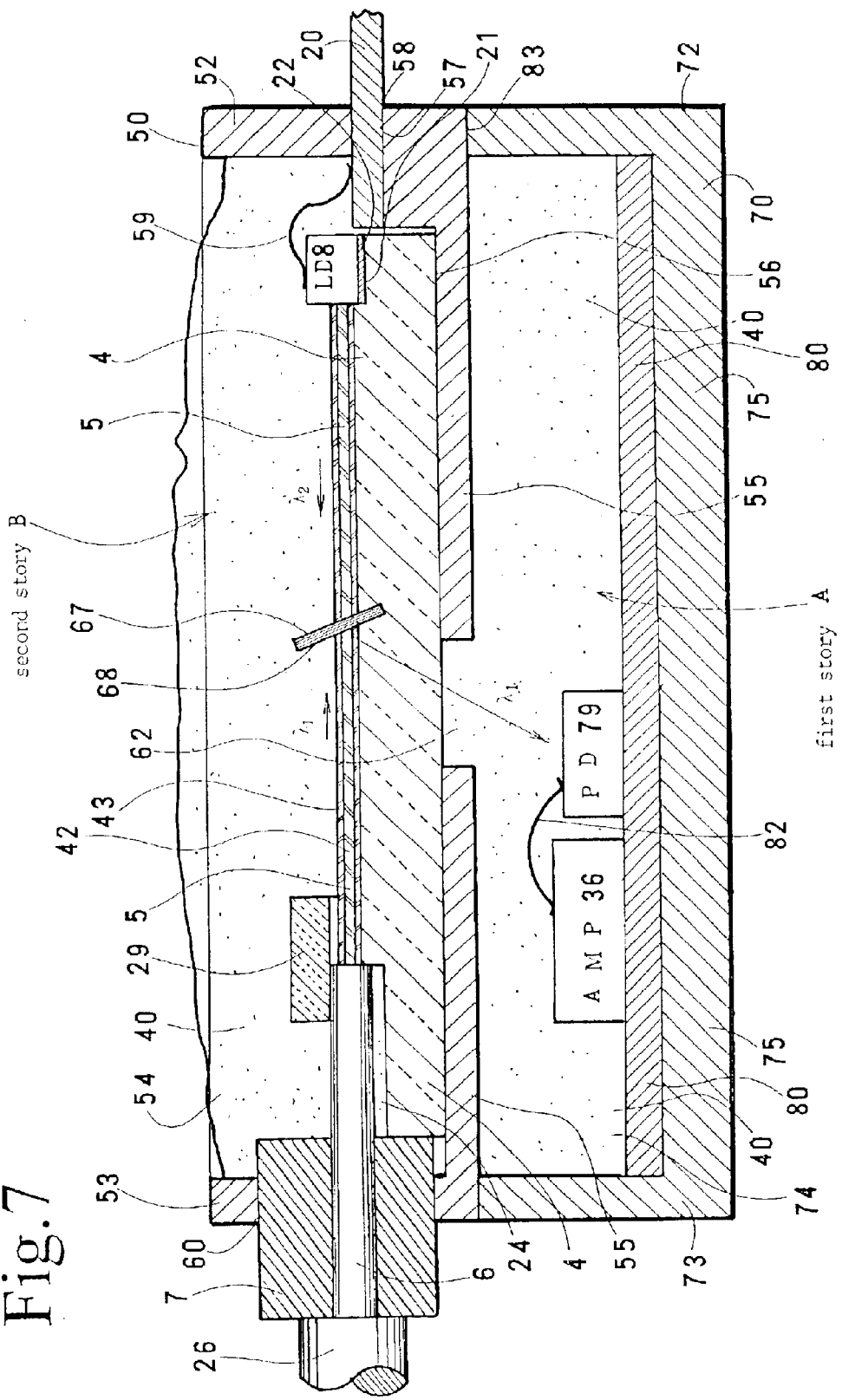
FIG. 7 is a vertically sectioned side view of another optical communications module as Embodiment 2 having an upper case with lightwaveguides/LDs and a lower case with PDs.

[Embodiment 2 (Lower PDs, Upper LDs: FIG. 7)]

FIG. 7 shows a vertical sectional view of an LD/PD module arranging LDs on an upper story and PDs on a lower story as Embodiment 2. Embodiment 2 is similar to Embodiment 1 in a structure coupling a lower package and an upper package. But, Embodiment 2 has a reverse relation to Embodiment 1 in the allocations of LD/PD.

An upper package 50 is a transmitting module containing a lightwaveguide and a laser diode (LD). The upper package 50 stores a silicon bench 4. The silicon bench 4 has a lightwaveguide 5 on an upper surface. The lightwaveguide 5 is made with a resin, for example, a fluoride polyimide resin. A core/cladding structure is formed by giving a difference of refractive index between the core and the cladding by doping either the core or the cladding with an impurity. Of course, an alternative SiO2 waveguide can be fabricated by thermally oxidizing a surface of a silicon substrate. FIG. 7, which is a vertical sectional view, shows a single waveguide 5. But actually, a plurality (M) of parallel waveguides, e.g., four, eight or sixteen lightwaveguides, can be made on the silicon bench 4 for making multichannel LD/PD modules. Embodiment 2 is similar to Embodiment 1 in the point.

Optical fibers 6 are coupled to front ends of the lightwaveguides 5 on the silicon bench 4. The optical fibers 6 are supported by an optical connector (MT connector) 7. The number of the optical fibers 6 is equal to the number of the waveguides (M) 5. Laser diodes (LDs) 8 are mounted at ends of the lightwaveguides 5 on the silicon bench 4. The number of the LDs is also M. The second story B in the upper package requires exact alignment among the LDs 8, the waveguides 5 and the optical fibers 6 on straight lines. Thus, the silicon bench is used for alignment in the upper story B.

The upper package 50 is a top-open rectangular resin package having a rear wall 52, a front wall 53, side walls 54 and a bottom plate 55. A bottom window 62 is perforated at a center of the bottom plate 55 for guiding receiving light to the lower first story A. The upper package with the bottom window can be easily fabricated by transfermolding a plastic material with a metallic mold.

The upper package 50 has a wide cavity 56, in which the rectangular silicon bench 4 is inserted and fixed in the cavity 56. The rear wall 52 has a step 57 for sustaining leadpins 20 which horizontally pierce the rear wall 52. Insert molding makes the upper package having a leadframe which has a plurality of leadpins. The silicon bench is transparent for light of wavelengths from 1 to 1.6 $\mu$m which are utilizes in optical communications systems. Thus, it is unnecessary to perforate holes in the silicon bench for guiding light therein.

A slightly lower step 21 is formed at ends of the waveguides 5 on the silicon bench 4. The step is made by eliminating an end part of the waveguides and a part of substrate and making metallized pads 22. Laser diodes (LDs) are upside down fitted upon the lower step 21. The height of the cores of the waveguides are adjusted to the height of the active stripe layer (emission layer) of the LDs by the step 21. Lower stripe electrodes on the LDs 8 are die-bonded on the metallized pads 22 of the step 21. The upper electrodes of the LDs 8 are connected by wires 59 to the leadpins 20. The connection structure is similar to the lower package in Embodiment 1.

The number M, which is the number of the waveguide, the PDs and the LDs, can be either single or plural, e.g., four, eight or sixteen. Connection of plural LDs has three different modes. One is a cathode/anode separation type which separates both anodes and cathodes of LDs. Another is a cathode separation type which has a common anode and separated cathodes. A further is an anode separation type which has a common cathode and separated, individual anodes.

M parallel V-grooves 24 are formed at front ends of the silicon bench 4. The V-grooves are made by making use of anisotropic etching of a silicon single crystal substrate. M parallel optical fibers 6 are fixed in the V-grooves 24. Fronts of the optical fibers 6 are maintained in parallel in the optical connector 7. The optical connector 7 is a rectangular block made by a resin.

The optical connector 7 is inserted and fixed in a connector hole 60 perforated at the front wall 53 of the package. The optical fibers 6, which are short, have front ends contained just in a front surface of the connector. Rear ends of the fibers 6 are embedded in the V-grooves 24 on the silicon bench 4. Joints of the fiber ends to the lightwaveguides 5 are covered with a cap 29. The optical connector 7 has two parallel guidepins 26 extending in a front direction on the front.

The guidepins enables the connector to couple to another optical connector (not shown in figures) having holes by inserting the guidepins to the holes. The connection is similar to Embodiment 1.

A slanting groove 67 is perforated at a middle region of the lightwaveguides 5. WDM filters 68 are inserted into the slanting groove 67. The WDM filter has wavelength selectivity which allows λ2 light emitted from the LDs 8 to pass but reflects λ1 light propagating from the fiber 6 in a downward direction. The WDM 68 is a filter made of piled transparent dielectric multilayers. Directions of the reflection and the slanting groove 67 in Embodiment 2 are reverse to Embodiment 1.

Figure 19:
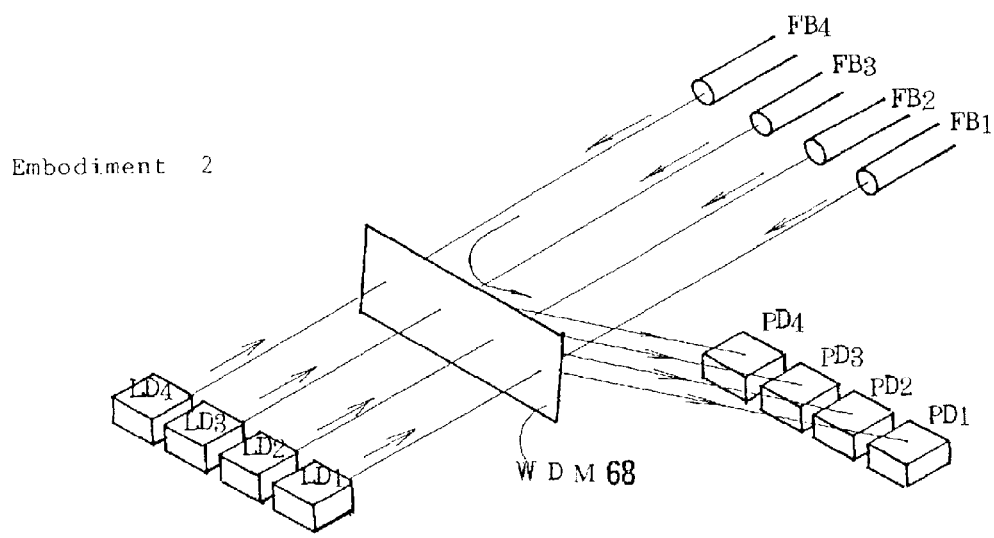
FIG. 19 is a schematic perspective view of Embodiment 2 for clarifying light paths being branched by a WDM and joining fibers, PDs and LDs. The downward slanting WDM reflects beams from the fibers downward to the PDs and allows LD beams to pass through to the fibers.

FIG. 19, which depicts a case of M=4, demonstrates wavelength selectivity of the WDM filter 68. Embodiment 2, which allocates the signal receiving PDs on the ground floor, disposes the WDM slantingly downward in the lightwaveguides. Receiving signal beams emanating from the optical fibers FB1 to FB4 are reflected downward by the wavelength selectivity of the WDM and are introduced into the PDs via top openings, which are cathode apertures in the case of a bottom incidence type or anode windows in the case of a top incidence type. Transmitting beams made by the LDs (LD1 to LD4) pass the WDM without significant loss, enter the fibers FB1 to FB4 and propagate to external fibers. The directions of the WDM filter are reciprocal between Embodiment 1 and Embodiment 2. Embodiment 1 reflects signal beams upward (FIG. 18). Embodiment 2 reflects signal beams downward (FIG. 19).

A portion built in a lower case is optionally called a first floor portion A. The lower case 70 is a rectangular vessel having a rear end wall 72, a front end wall 73, side walls 74 and a bottom plate 75. Portions of a leadframe 80 are unified to the bottom plate 75. The lower case is made of a resin, for example, a liquid crystal polymer. The portions of the leadframe unified to the bottom 75, in practice, have complex wiring patterns for connecting PDs, leadpins and AMPs with each other, although FIG. 7 drafts the leadframe 80 as a flat plank for simplicity.

The leadframe 80, which has been made by punching a thin metallic plate with a patterned punch, has multibranched, complex wiring patterns and many parallel leadpins. A PD 79 and an AMP 36 are mounted upon portions of the leadframe 80. The PD 79 is a top-incidence type PD. Bottoms of the PD and the AMP are, in practice, separated from each other. An example of wirings among the LDs, PDs and AMPs is drafted in FIG. 5. Another example will be described later.

Leadpins of the PD leadframe 80 extend in the directions on both sides on the lower case 70. Insert molding of metal/resin unifies the PD leadframe 80 to the lower case and the LD leadframe to the upper case 50. The upper case leadpins are different in height from the lower case leadpins.

The PD leadpins, which extend on both sides from the package, do not appear in FIG. 7.

Cathodes of the PDs 79, which are n-electrodes and bottom electrodes, are connected via the leadframe and leadpins to a positive terminal of a power source in order to reversely bias the PDs 79. Anodes of the PDs 79, which are p-electrodes and top electrodes, are connected to an input pad of the AMP 36 by wires 82. Photocurrents, which flow out of the anodes of PDs, are amplified by the AMPs 36. Examples of connections among the PDs, the AMPs and the leadframe are shown in FIG. 5 and in another figure which will be later described about.

The upper case 50 and the lower case 70 are unified by piling the upper case 50 on the lower case 70 and gluing the cases at contact portions 83. The coupling realizes a relation of allowing the light emitted from the fiber and reflected by the WDM 68 to pass the floor (bottom) hole 62 and to shoot the top of the PD 79. The PD 79 is a top-incidence type PD having a top aperture which lies in a locus of the light reflected from the WDM 68. The upper case (second floor B) is supplied with a fluid, low-refractive index, transparent resin 40. The transparent resin 40 is, for example, one of silicone-type (thermal-hardening or ultraviolet-hardening) transparent resins or one of acrylate-type (thermal-hardening or ultraviolet-hardening) transparent resins. The resin fluid passes resin guiding holes (not shown in FIG. 7) to the lower case 70 (first floor A) and fills entirely the space of the first floor without air bubbles.

The fluid transparent resin 40 comes into tight contact with the lightwaveguides 5, the LDs 8, the wires 59, the leadpins 20, the PDs 79 and the AMPs 36 without gap. The transparent (thermal- or ultraviolet-set) fluid resin is hardened by heating or irradiating with ultraviolet rays. The set resin has a refractive index (1.4 to 1.5) similar to (quartz) optical fibers. Similarity of the refractive index enables the resin to reduce reflection loss at the fiber ends (fiber/resin interface).

The above steps make two-storied half-products having the upper case, the lower case, the leadframes, the PDs and the LDs. The whole of the half-products are transfermolded by a rigid resin material 48. The resin material 48 is opaque, rigid, air-tight and water-proof. The external resin is, for example, an epoxy resin.

In the case of an LD/PD module at a central station, the LDs generates $\lambda 2$ (1.55 $\mu$m band) as transmitting signal light. The $\lambda 2$ transmitting light signals propagate in the lightwaveguides 5 and go into external optical fibers via the short fibers 6. Receiving light signals running in external fibers and the short fibers go into the lightwaveguides 5. The receiving light is reflected by the slanting WDM 68 downward, passes the silicon bench 4, which is transparent to $\lambda 1$, and goes into the PDs 79. The PDs yield photocurrents which are in proportion to the power of signal light. The AMP amplifies the photocurrent. Amplified electric signals are taken out via the side leadpins.

Figure 8:
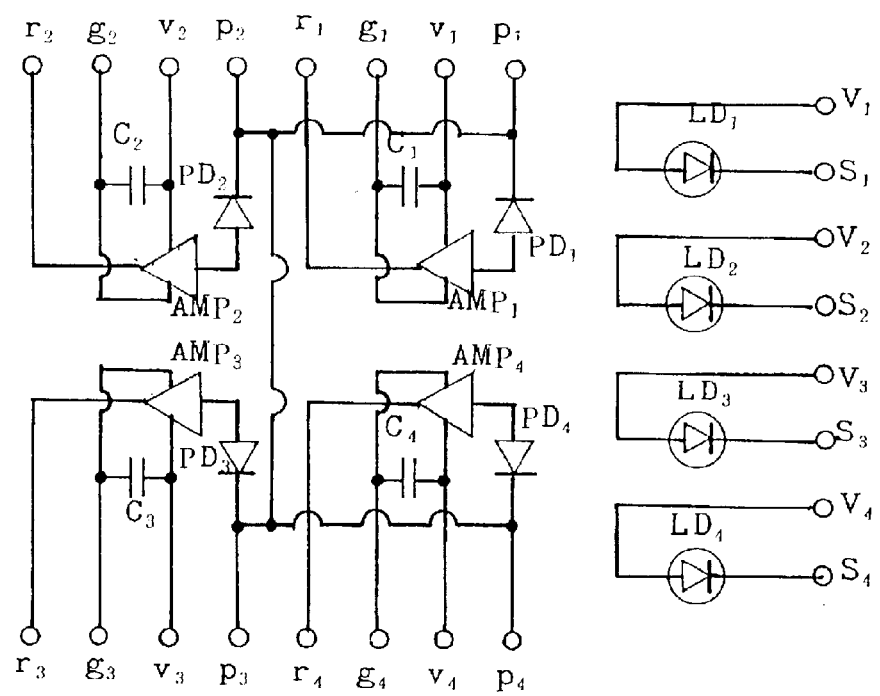
FIG. 8 is another wiring diagram of four sets of PDs, AMPs, LDs and leadpins in Embodiments 1 and 2.

FIG. 8 shows another example of a wiring circuit among PDs, AMPs and LDs different from FIG. 5. All the anodes of $LD_1$, $LD_2$, $LD_3$ and $LD_4$ are connected to independent pins $V_1$, $V_2$, $V_3$ and $V_4$. All the cathodes of $LD_1$, $LD_2$, $LD_3$ and $LD_4$ are connected to independent pins $S_1$, $S_2$, $S_3$ and $S_4$. All the cathodes and anodes are electrically isolated with each other. FIG. 8 has a PD part similar to FIG. 5. In FIG. 8, reverse bias pins $p_1$, $p_2$, $p_3$ and $p_4$ for the cathodes of PDs are connected with each other. A use of an array of PDs having a common bottom cathode gives such combined cathode biasing pins.

Figure 9:
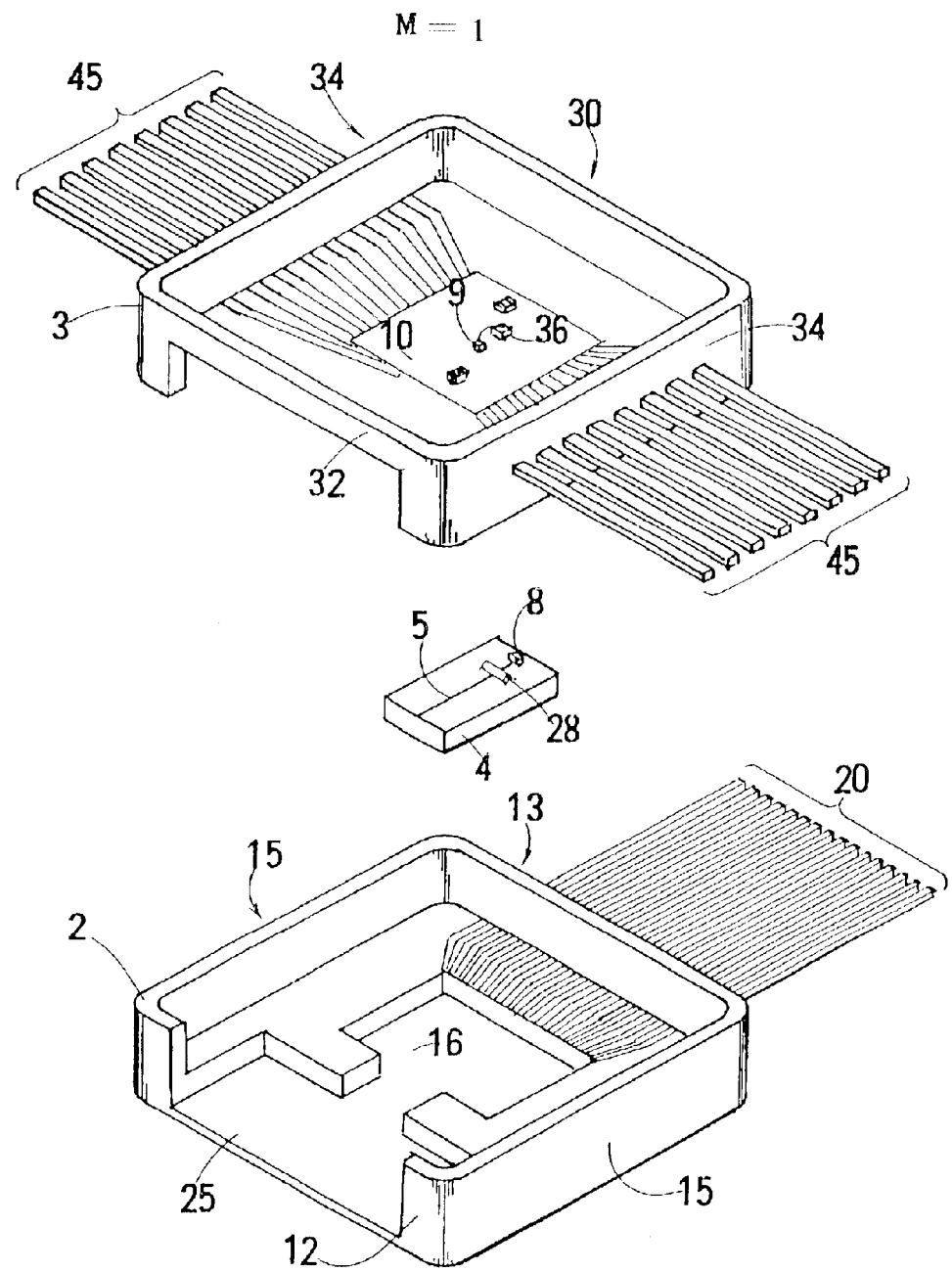
FIG. 9 is a perspective view of Embodiment 3 (M=1) of a single channel in a pre-coupling, dissembled state having an upper case with a PD and a lower case with an LD on a bench.

[Embodiment 3 (M=1, Upper PD, Lower LD: FIG. 9)]

The present invention excels in saving space. The space-saving feature appears conspicuous, in particular, in multichannel modules. This invention can be applied to a single channel LD/PD module on an ONU (optical network unit; subscriber). FIG. 9 shows a perspective view of Embodiment 3 for an ONU of M=1. The vertical section of Embodiment 3 is identical to FIG. 1 of Embodiment 1. Thus, FIG. 9 and FIG. 1 denote Embodiment 3 of M=1.

A leadframe is unified to an upper resin case 3 by insert-moulding. A PD 9 and an AMP 36 are mounted upon some wiring portions of the leadframe of the upper case 3. Leadpins 45 of the leadframe extend on both sides of the upper case. Details of the leadframe are omitted here.

A lower case 2 has a silicon bench 4. A single lightwaveguide 5 is formed in a longitudinal direction on the silicon bench 4. An LD 8 is mounted upon an end of the lightwaveguide 5. A slanting groove is formed midway of the lightwaveguide. A WDM 28 is fixed slantingly in the groove. The lower case consists of a resin portion and a leadframe which are formed in a body by insert-molding. The leadframe has leadpins 20 for LDs which extend outward from the end of the lower case 2. The lower case has a cavity 16 in which the silicon bench 4 is maintained. The upper case is unified to the lower case.

A transparent resin is filled into the unified cases. The whole of the cases is molded into a device with a rigid resin material, e.g., epoxy resin.

Fabrication processes are described. These size of the silicon substrate 4 is 1.5 mm×7.5 mm×1 mm. In practice, a silicon wafer of a 1 mm thickness is prepared. A plurality of chips of the size of 1.5 mm×7.5 mm×1 mm are allocated upon the round silicon wafer. Wafer process makes predetermined lightwaveguides, steps and metallize wirings on the silicon wafer which has common patterns to every allocated chip. Then, the wafer is diced into a lot of chips of a size of 1.5 mm×7.5 mm.

Conductive transparent films are made by painting fluid transparent conductive resins upon the silicon wafer by a spin coating method. An undercoating cladding resin is formed into a 10 $\mu$m thick film and a core resin is formed into a 6.5 $\mu$m thick film on the undercoating cladding resin. Core stripes of a 6.5 $\mu$m×6.5 $\mu$m square section are made along center lines of the allocated chips by eliminating except 6.5 $\mu$m central stripes by photolithography and dry etching. A 10 $\mu$m thick cladding fluid resin is further painted upon the cladding/core resins. Triple-layered lightwaveguide having cladding/core/cladding is formed on the silicon wafer. The core having a 6.5 $\mu$m×6.5 $\mu$m section extends in the lightwaveguide.

A slanting groove 27 of a 20 $\mu$m width is made on the lightwaveguide 5 by mechanically dicing the silicon bench at a midway of the waveguide. A normal standing upon the slanting groove walls inclines at 30 degrees to the waveguide. A rear end of the lightwaveguide has a lower step. The lower step has a metallized pad for the LD. The wafer process makes such a silicon wafer having the waveguide, the groove, the step and the metallize mentioned hitherto. The wafer process is ended. The processed wafer is divided into a plurality of module chips of a size of 1.5 mm×7.5 mm×1 mm by mechanically dicing lengthwise and crosswise.

A 1.3 $\mu$m band LD 8 is mounted at a marked point upon the metallize of the rear end of the lightwaveguide of the isolated chips by an AuSn solder. The mark, which has been inscribed on the silicon bench for determining an optimum position of the LD for coupling to the waveguide, dispenses with time-consuming optical alignment of the LD with the waveguide. The WDM filter 28 is inserted and fixed in the slanting groove dug in the midway of the lightwaveguide 5. The WDM filter 28 is made by piling a plurality of layers of dielectric films on a transparent polymer substrate. The WDM has a characteristic of allowing 1.3 μm light shooting the filter at 30 degrees to pass and reflecting 1.55 μm light shooting the filter at 30 degrees.

The lower case 2 is made by insert-molding a liquid crystal polymer and a leadframe in a metallic mold. The lower case 2 has a size of 5 mm×15 mm×1.5 mm. 15 mm is a total length including the leadpins. The silicon bench 4 is inserted and fixed in the cavity 16 of the lower case 2. The leadframe, which is made by punching a thin metallic plate, has wirings for the LD. All the wirings and the leadpins are made from the thin metallic plate by punching with a patterned tool at a stroke.

The upper case 3 is also made by insert-molding a liquid crystal polymer and a leadframe in a metallic mold. The upper case 3 has a size of 15 mm×5 mm×1.5 mm. 15 mm is a total length including the leadpins. The leadframe, which is made by punching a thin metallic plate, has wirings for the PD, wirings for the AMP, leadpins and a floor hole (bottom hole) of a 0.1 mmφ. All the wirings and the leadpins are made from the thin metallic plate by punching with a patterned tool at a stroke. The PD and AMP are mounted upon wiring patterns of the leadframe of the upper case 3. Sometimes noise-cut capacitors, noise-cut coils and resistors are mounted and brazed by a silver-paste upon the wiring patterns of the leadframe. FIG. 9 shows noise-cut capacitors, which are not indispensable for the module. The wiring patterns of the leadframe are connected to the PD and the AMP by golden (Au) wires of a 25 μm φ.

A mark is designated upon the PD and the silicon bench for alignment, which is sometimes called passive alignment. The upper case and the lower case are coupled by putting the cases on a stage in a visual field of a microscope, observing the PD mark on the upper case and the bench mark on the lower case by the microscope, processing the images, determining an exact position of the cases, painting an ultravioletset resin, picking up one of the cases, carrying it to the other case and coupling the carried one to the other case.

Then, the coupled cases are transfermolded in a metallic mould with a hard resin. FIG. 4 shows a final shape of a completed LD/PD module. The size of the device except leadpins is 8 mm×10 mm×4.5 mm.

[Embodiment 4 (M=4, Upper PDs, Lower LDs:FIG. 10)]

Figure 10:
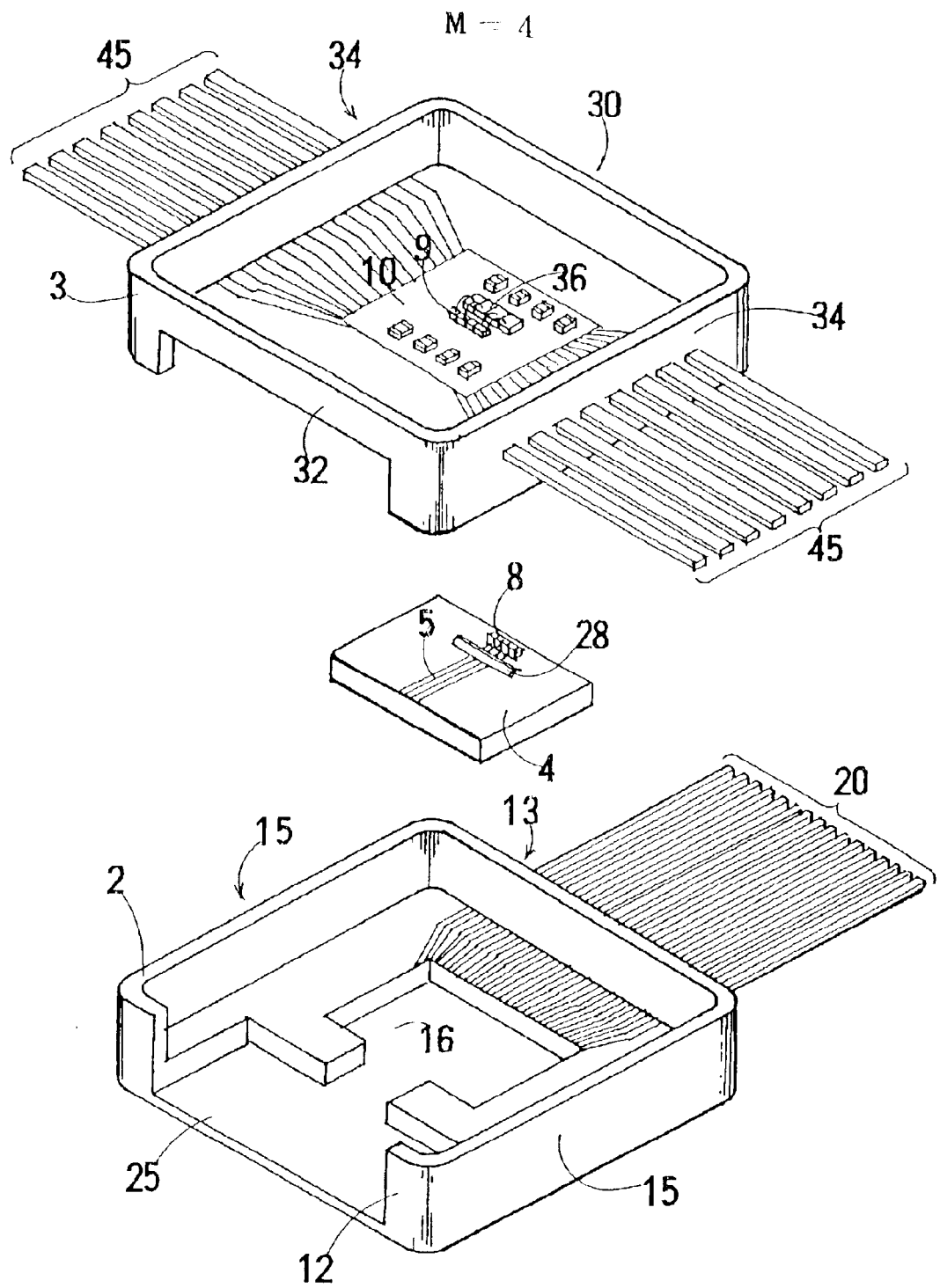
FIG. 10 is a perspective view of Embodiment 4 (M=4) of four channels in a pre-coupling, dissembled state having an upper case with four PDs and a lower case with four LDs on a bench.

This invention has an effect of saving space in multichannel modules. The feature suitable for multichannel communications is clarified by an embodiment of M=4. FIG. 10 denotes Embodiment 4 of M=4. This is a four channel LD/PD station module. The section is similar to FIG. 1 of Embodiment 1.

Insert-molding prepares a unified upper case 3 having a resin vessel with a leadframe. Like Embodiment 1, Embodiment 4 mounts four PDs 9 and four AMPs 36 on the upper case 3. Besides, resistors or capacitors can be mounted upon the upper case. Four floor holes 38 of a 0.1 mm φ on the leadframe for guiding light reflected by a WDM 28 to the PDs.

Four parallel lightwaveguides 5 (M=4) are formed in a longitudinal direction on a silicon bench 4. A slanting groove is formed midway on the lightwaveguides 5 of the silicon bench 4. Four LDs 8 are bonded on metallized pads at the ends of the lightwaveguides 5 on the Si-bench. A WDM 28 is fixed in the slanting groove. A lower case 2 is made of a resin integrated with a leadframe. Leadpins 20 for the LDs 8 extend at the back of the lower case 2. The silicon bench 4 is inserted in a cavity 16 of the lower case 2. Then, a transparent resin is supplied to the upper case 3 and the lower case 2. The united cases are transfermolded with another hard resin. A finished device is shown in FIG. 4. The size of Embodiment 4 of M=4 is the same as another embodiment of M=1.

Embodiment 4 is different from Embodiment 1 in the connection of the PDs and the AMPs. A train of the AMPs is parallel to a train of the PDs. Wires connecting the PDs and the AMPs are parallel to each other in Embodiment 4.

[Embodiment 5 (M=8, Upper PDs, Lower LDs: FIG. 1)]

Figure 11:
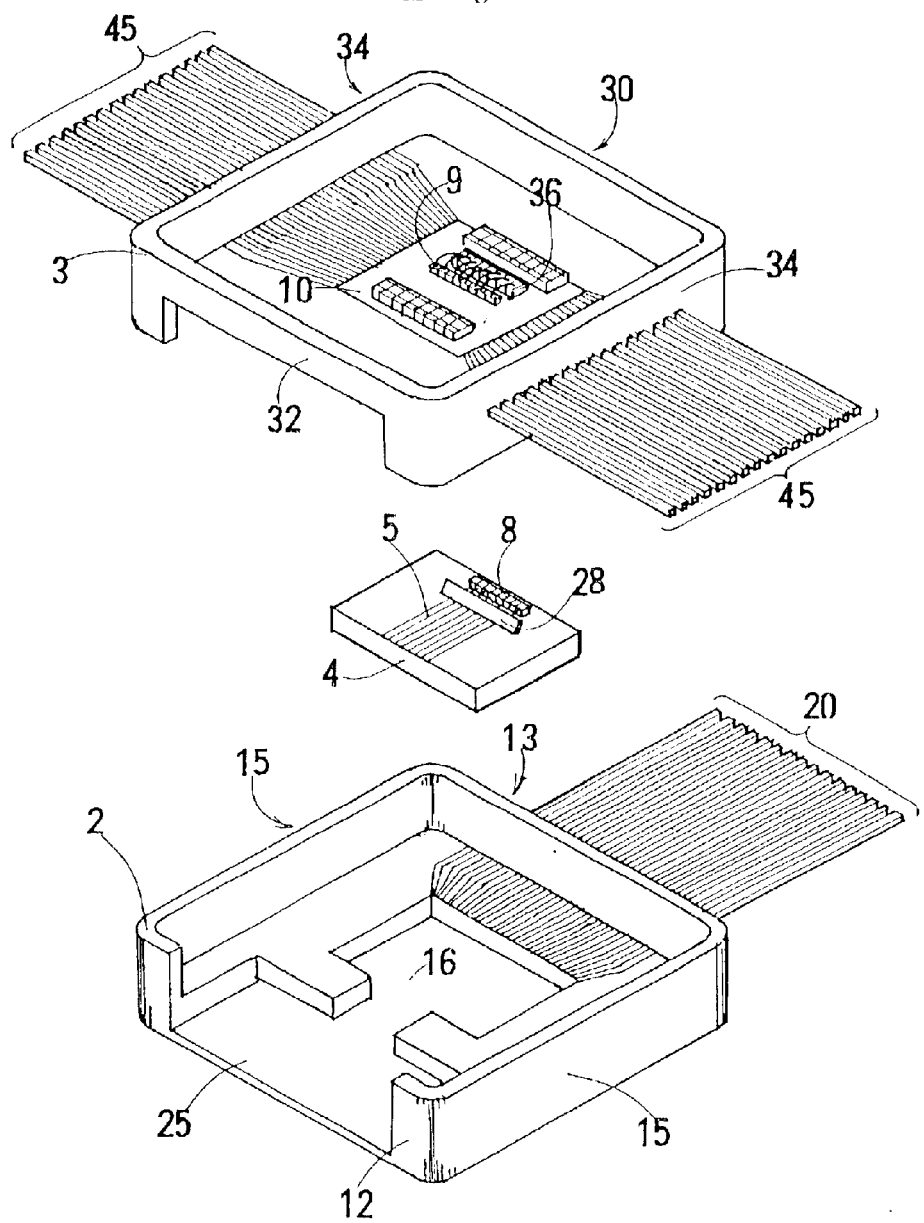
FIG. 11 is a perspective view of Embodiment 8 (M=8) of eight channels in a pre-coupling, dissembled state having an upper case with eight PDs and a lower case with eight LDs on a bench.
Figure 12:
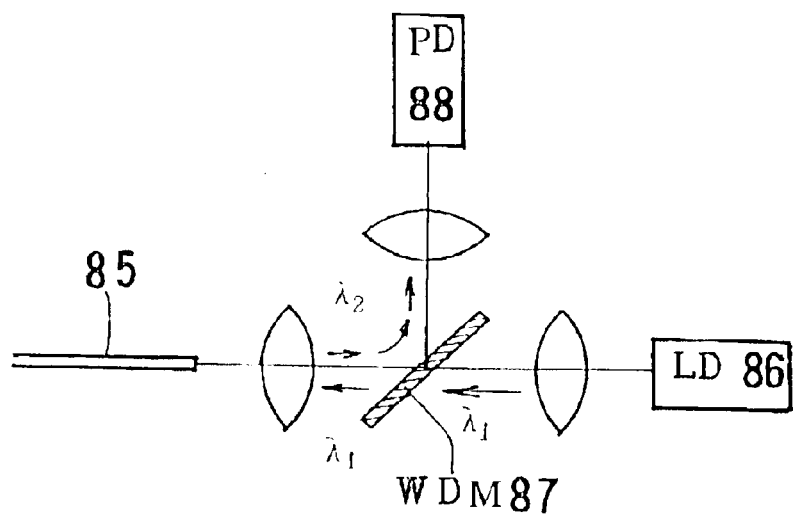
FIG. 12 is a plan view of the well-known module allocating an LD, a PD and an optical fiber at three positions around a central WDM.
Figure 13:
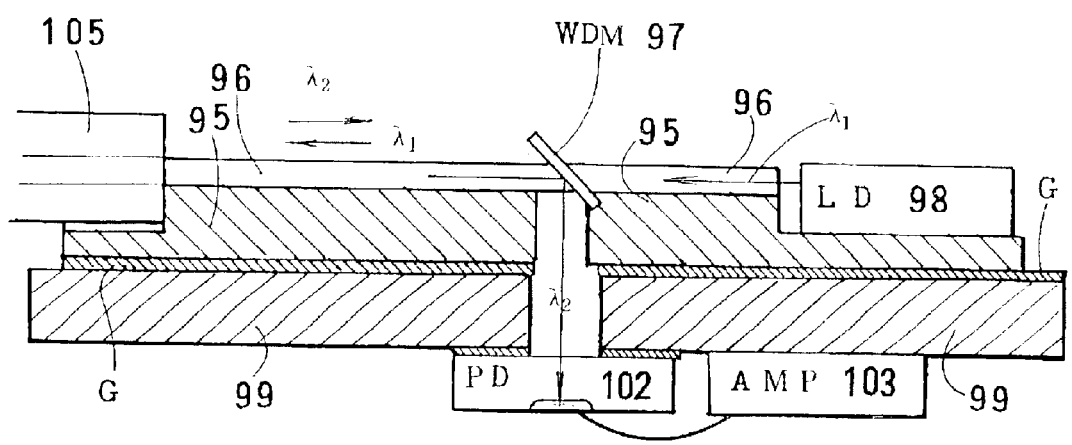
FIG. 13 is a sectional view of the known module proposed by Japanese Patent Laying Open No. 11-218651.
Figure 14:
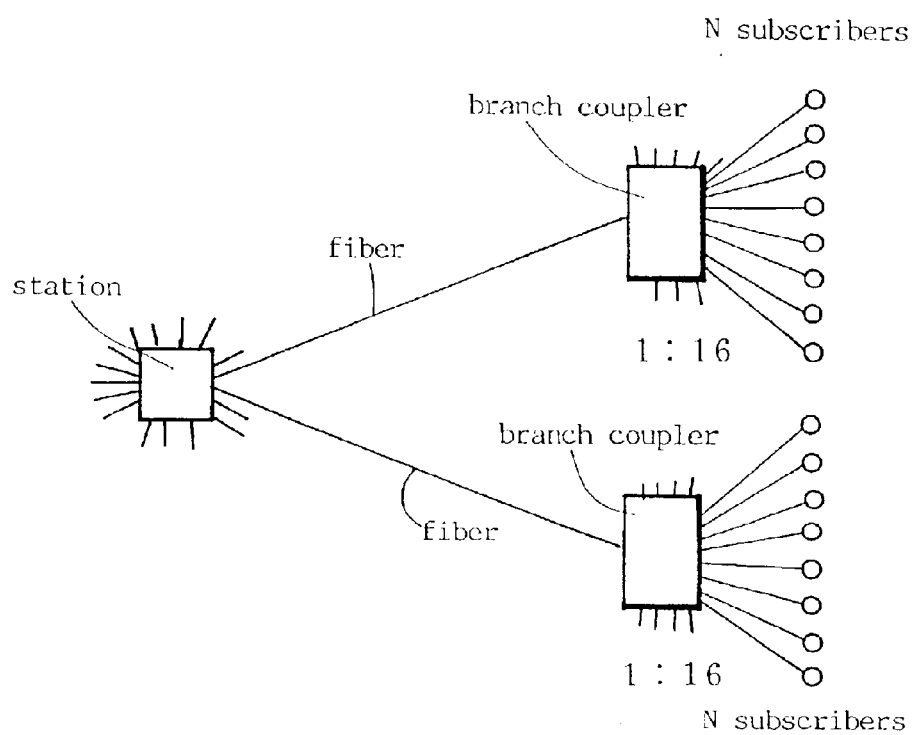
FIG. 14 is a diagram of the previously proposed optical fiber network interposed by 1:16 branch couplers between a central station and N ONUs (subscribers).
Figure 15:
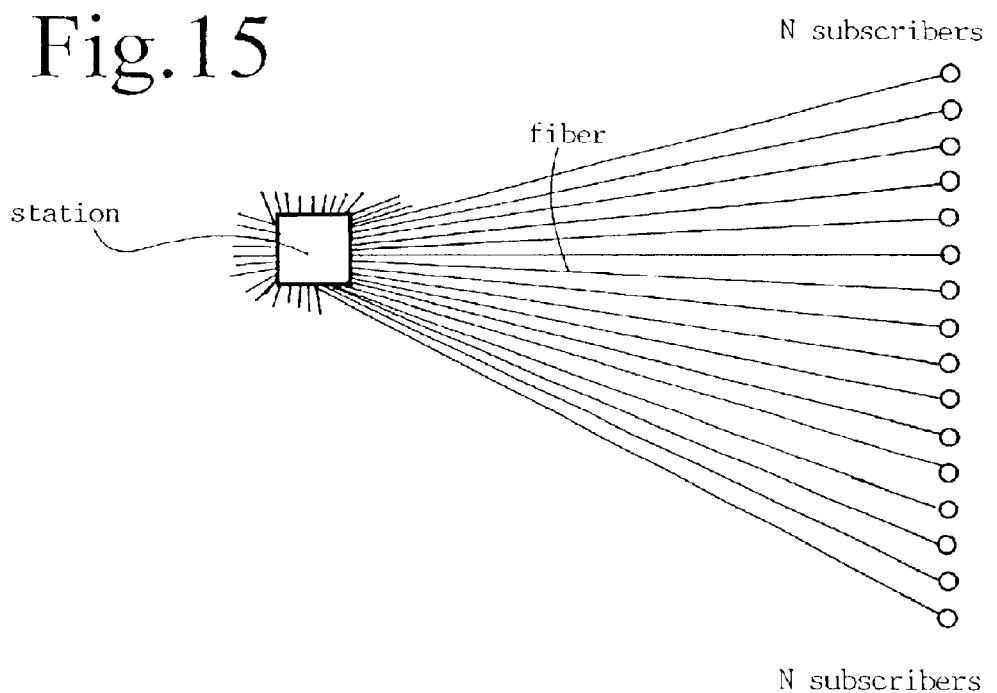
FIG. 15 is another diagram of an optical fiber network which connects a central station with N ONUs by N individual, independent fibers without branch couplers.

This invention excels in an effect of saving space in multichannel modules. The feature suitable for multichannel communications is clarified by an embodiment of M=8. FIG. 11 shows Embodiment 5 of M=8. This is an eight channel LD/PD module installed in a central station. Thus, λ2 (1.55 μm) is a transmitting light wavelength and λ1 (1.3 μm) is a receiving light wavelength in the station module.

Embodiment 5 mounts eight PDs 9 and AMPs 36 on an upper resin case 3. The PDs 36 are assembled into an eight-train PD array. Insert molding unifies a leadframe for the PDs 9 with the upper resin case 3 into a body. The PDs, the AMPs and capacitors are mounted upon the upper case 3 in Embodiment 5. Besides, the upper case can contain resistors or coils. Eight bottom holes 38 of 0.1 mm φ are perforated through the bottom of the upper case 3.

Eight lightwaveguides 5 are longitudinally formed in parallel on a silicon bench 4. Eight LDs 8 are fixed at ends of the lightwaveguides 5. A slanting groove is dug midway on the lightwaveguides on the silicon bench. A WDM 28 is inserted and fixed in the slanting groove. A lower case 2 consists of a resin (liquid crystal polymer) and a leadframe having leadpins 20, which extend backward out of the case, for mounting the LDs 8. The silicon bench 4 is inserted into a central cavity 16 of the lower case 2. A transparent resin is potted into the upper and lower cases for filling spaces. Transfermolding with epoxy makes a complete device as shown in FIG. 4. Embodiment 5, which is a case of M=8, has a size similar to Embodiment 3 which has an M=1 set of a PD, LD and waveguide.

Figure 16:
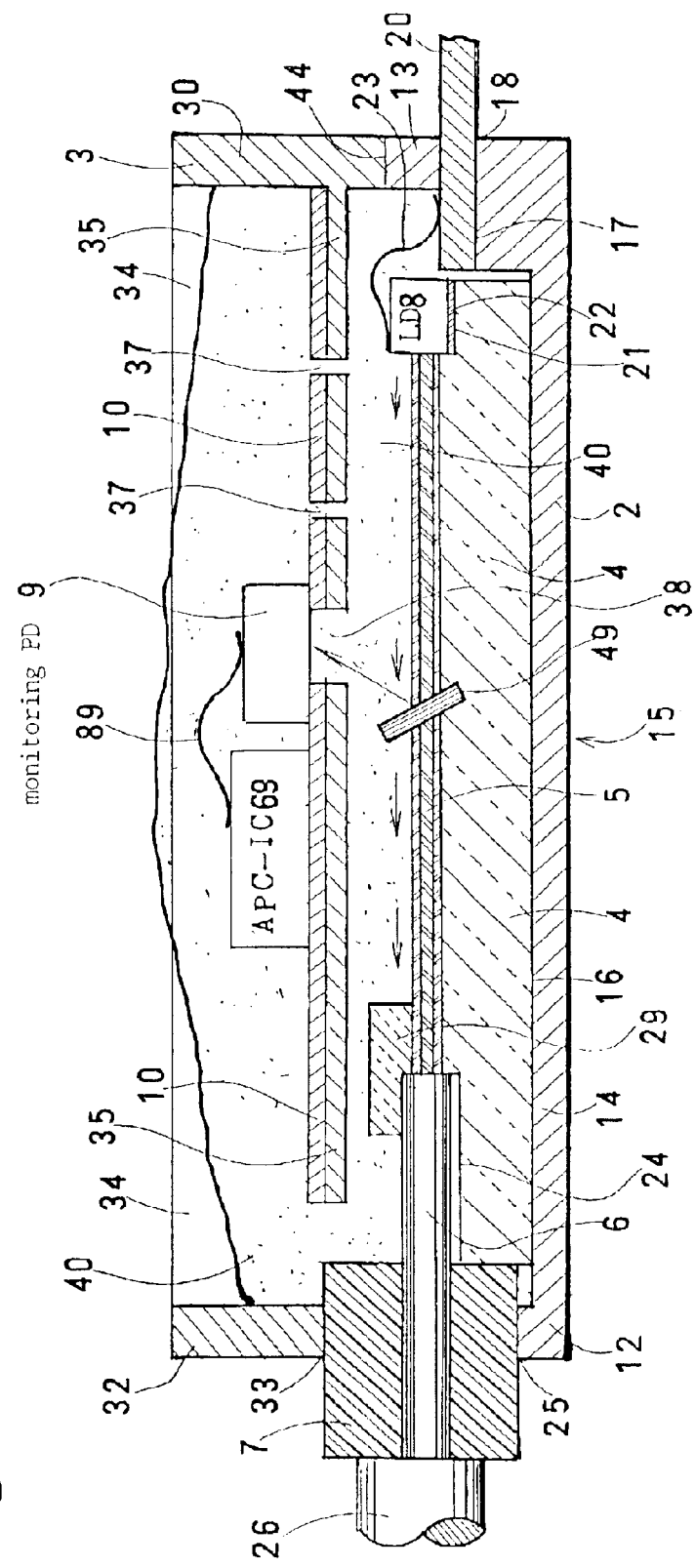
FIG. 16 is a vertically sectioned side view of an optical communications module as Embodiment 6 having an upper case with monitoring PDs and a lower case with LDs and lightwaveguides before transfermolding.

[Embodiment 6 (Lower LDs, Upper Monitoring PDs: FIG. 16)]

FIG. 16 shows Embodiment 6 having transmitting laser diodes (LDs) on a ground floor (lower case) and monitoring photodiodes (PDs) on a second floor (upper case). The number M of LDs, lightwaveguides, monitoring photodiodes (PDs) is one, four, eight, twelve, sixteen, or an arbitrary number. Numerals indicating the same parts as that of FIG. 1 are denoted in FIG. 16 by the same number as FIG. 1.

Like Embodiment 1 LD/PD module, Embodiment 6 has a lower case 2 and an upper case 3. The lower case 2 is a top-opening case consisting of a front wall 12, a rear wall 13, a bottom plate 14 and side walls 15. A rectangular silicon bench 4 is inserted and fixed in a cavity 16 of the lower case 2. M lightwaveguides 5 are formed on the silicon bench 4. The number of the lightwaveguides are one, four, eight, twelve, sixteen, thirty-two . . .

Back ends of the lightwaveguides 5 are slightly etched to a lower step 21 with a metallize pad 22. LDs 8 are epi-side down mounted upon the pads 22 of the step 21. M V-grooves 24 which align to the lightwaveguides 5 are perforated on the front part of the silicon bench 4. M optical fibers 6 are in parallel sustained in an optical connector 7 in a horizontal direction. The optical connector 7 is retained in a connector hole 33 at the front walls 12 and 32 of the lower and upper cases 2 and 3. Front halfs of the fibers 6 are maintained in the optical connector 7. Front ends of the fibers 6 coincide with the front surface of the connector 7. Rear halfs of the fibers 6 are buried in the M V-grooves 24. Rear ends of the fibers 6 are coupled to the lightwaveguides 5. Guidepins 26 project at the front of the optical connector 7.

A beamsplitter 49 is slantingly fixed in a groove dug obliquely midway on the lightwaveguides 5 of the silicon bench 4 instead of a wavelength division multiplexer (WDM). The beamsplitter, which has no wavelength selectivity, reflects only a part of light emitted from the LDs 8 upward to monitoring photodiodes on the upper floor. The beamsplitter 49 does not reflect receiving light propagating in an external fiber but reflects the transmitting light emitted from the LDs. The beamsplitter is not endowed with wavelength selectivity. The beamsplitter plays a role of a half mirror.

Figure 20:
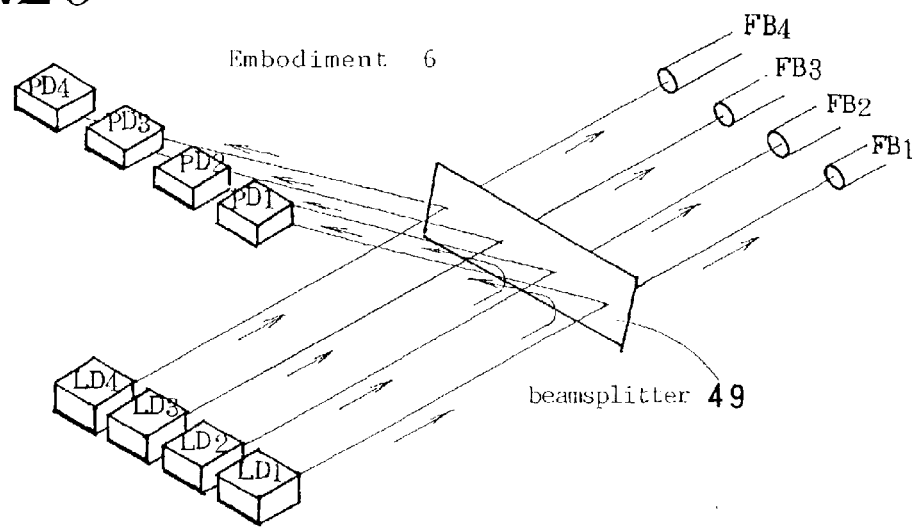
FIG. 20 is a schematic perspective view of Embodiment 6 for clarifying light paths being divided by a beamsplitter and joining fibers, monitoring PDs and LDs. The upward slanting beamsplitter reflects beams from the LDs upward to the monitoring PDs and allows the rest of the LD beams to pass through to the fibers.

FIG. 20 shows light beam divisions by the beamsplitter 49 in Embodiment 6. FIG. 20 denotes an example of M=4. Embodiment 6, which places monitoring PDs on the upper floor, mounts the beamsplitter facing upward for reflecting parts of beams slantingly upward. Since Embodiment 6 is not an LD/PD module but an LD module, no receiving light signals come from the fibers FB1 to FB4 to the lightwaveguides.

Parts of the transmitting light beams emitted from the LDs (LD1 to LD4) are reflected by the beamsplitter 49 upward, and are guided into bottom openings of the monitoring PDs on the upper floor. The PDs make photocurrents in proportion to the power of the LDs. LD driving currents are adjusted for compensating the change of the power level of the LDs. The rest of the transmitting light beams of the LDs pass the beamsplitter 49 and go into the optical fibers (FB1 to FB4). In comparison with FIG. 18 of a light path diagram of Embodiment 1, which has a similarity of mounting PDs on the upper floor, the WDM is replaced by the beamsplitter and the slanting direction of the beamsplitter is inverse to the slanting direction of the WDM in Embodiment 6 (FIG. 20).

The beamsplitter 49 is arranged with a reflecting surface toward the LDs for reflecting LD beams slantingly upward to the PDs in Embodiment 6. On the contrary, the WDM filter 28 is installed with a reflecting surface toward fibers for reflecting receiving signal beams from the fibers slantingly upward to the PDs in Embodiment 1. With regard to the LD light beams, Embodiment 6 reflects a part of the LD beams by the beamsplitter 49 and allows the rest of the LD beams to pass there through, but Embodiment 1 reflects none of the LD beams and allows all the LD beams to pass.

The example of FIG. 16 shows that leadpins 20 are laid just behind the LDs 8 and the leadpins and the LDs are connected by short wires 23. Alternatively, LD-driving ICs can be provided just behind the LDs for connecting the LDs with the LD-driving ICs by short wires for reducing external noise invasion via wires.

Embodiment 6 has a second floor built on an upper case 3. The upper case 3 has M monitoring photodiodes (PDs) 9 in parallel. The upper case has neither a silicon bench nor lightwaveguides. The PDs 9 are not signal receiving PDs but monitoring PDs. The upper case 3 lacks preamplifiers (AMPs).

The upper case 3 is a top-opening vessel having side walls 34, a back wall 30, a front wall 32 and a floor bottom 35. Leadpins from a leadframe 10 extend outward in a horizontal direction out of the upper case. The leadframe 10 and case 3 are initially unified by insert-molding of a resin in a metallic die. The leadframe 10 on the upper case 3 has wirings, pads and leadpins. The monitoring PDs and the auto power controlling ICs (APC-ICs) are die-bonded upon the pads of the leadframe 10. The APC-ICs 69 and the PDs 9 are tied by wires 89. The APC-IC 69 is an IC having a function of maintaining the power of the LDs 8 by compensating a change of power outputs of the LDs which are detected by the monitoring PDs. Thus, the APC-ICs 69 and the LDs 8 are connected with each other by internal circuits or external circuits.

Transmitting beams generated by the LDs 8 run in the lightwaveguides 5. A part of the transmitting beams are reflected by the beamsplitter 49 upward to the bottoms of the monitoring PDs 9. The rest of the LD beams pass the beamsplitter 49, run in the lightwaveguides 5, go into the optical fibers 6 and propagate in external fibers.

A transparent resin 40 is filled within the upper case 3 and the lower case 2. Like FIG. 3 of Embodiment 1, all the cases are packaged within a hard resin, by transfermolding the unified cases with an epoxy resin. Packaging is similar to Embodiments 1 to 5.

Figure 17:
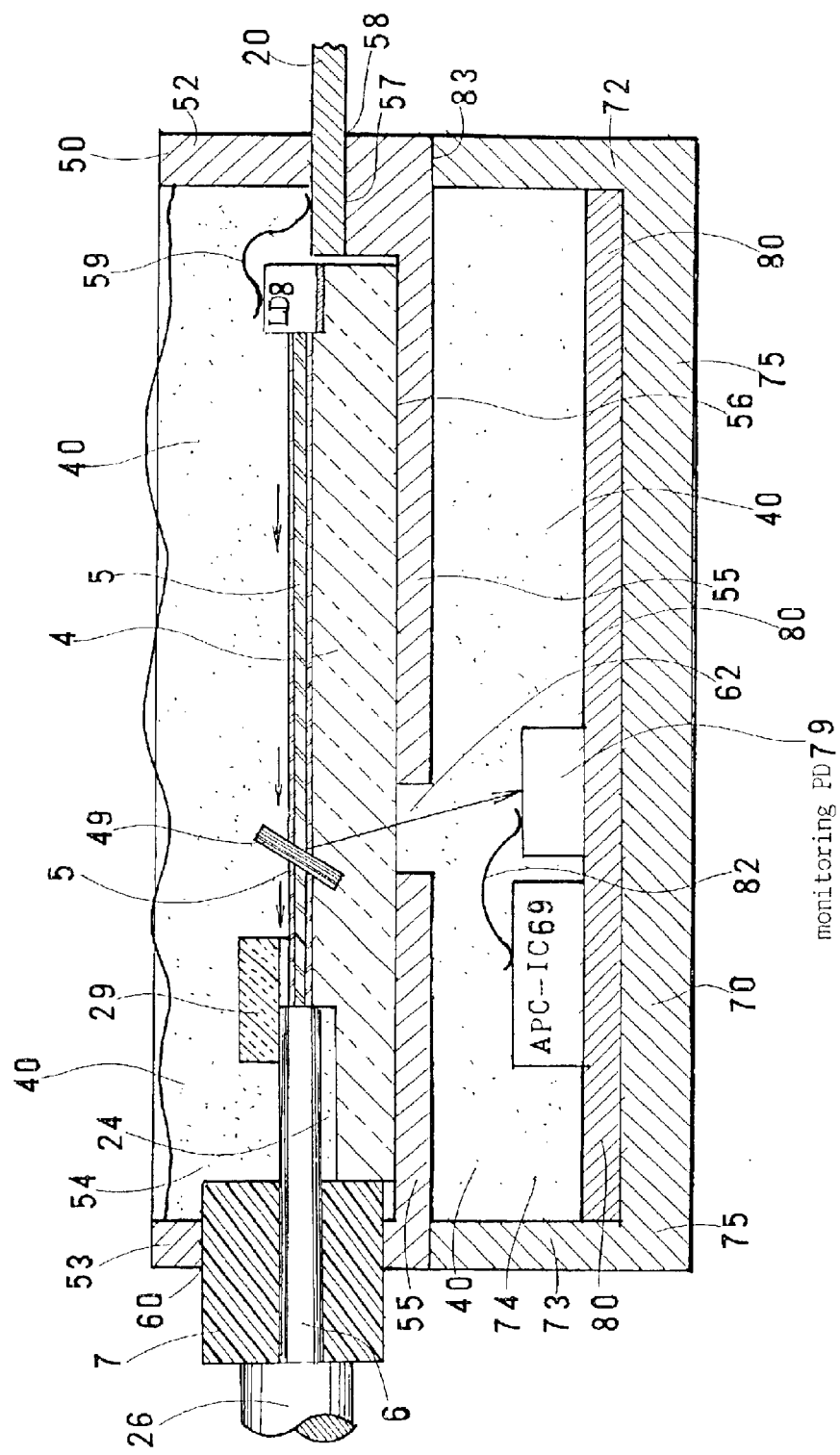
FIG. 17 is a vertically sectioned side view of an optical communications module as Embodiment 7 having an upper case with LDs and lightwaveguides and a lower case with monitoring PDs before transfermolding.

[Embodiment 7 (Lower Monitoring PDs, Upper LDs: FIG. 17)]

FIG. 17 shows Embodiment 7 having a second floor with LDs and lightwaveguides and a first floor with monitoring PDs. The relation between the LDs and the PDs is reverse to Embodiment 6. A silicon bench 4 having M lightwaveguides 5 and M laser diodes (LDs) 8 is laid on an upper case (second floor) 50. The number of the lightwaveguides and the LDs is one, four, eight, twelve, sixteen, . . . or an arbitrary number.

The M lightwaveguides 5 and M V-grooves 24 are made upon the silicon bench 4 on straight lines in parallel with a common spacing. The M laser diodes 8 for producing transmitting light signals are mounted upon a lower step at the ends of the lightwaveguides 5. A connector hole 60 of the upper/lower cases maintains an optical connector 7 containing M optical fibers 6 with tails in a horizontal direction. The optical connector 7 has two guidepins 26 on both sides of the front end. The tails of the optical fibers 6 projecting from the rear end of the optical connector 7 are retained in V-grooves 24 dug on the half front of the silicon bench 4. A plurality of leadpins 20 protrude from the rear end of the upper case 50. The leadpins are connected by wires 59 to upper electrodes of the laser diodes 8. The silicon bench 4 has a slanting lateral groove dug midway of the lightwaveguides 5. A beamsplitter 49 is fixed in the slanting groove. A bottom hole 62 is perforated on a bottom floor 55 of the upper case 50.

The slanting direction of the beamsplitter 49 intervening the lightwaveguides 5 is reverse to the WDM of Embodiment 2. Instead of the receiving light flowing from the optical fibers, the beamsplitter reflects parts of the transmitting LD signals downward. The beamsplitter has no wavelength selectivity unlike WDM. The reflected beams pass a floor hole 62, go into a lower case 70 and reach counterpart monitoring PDs 79.

Figure 21:
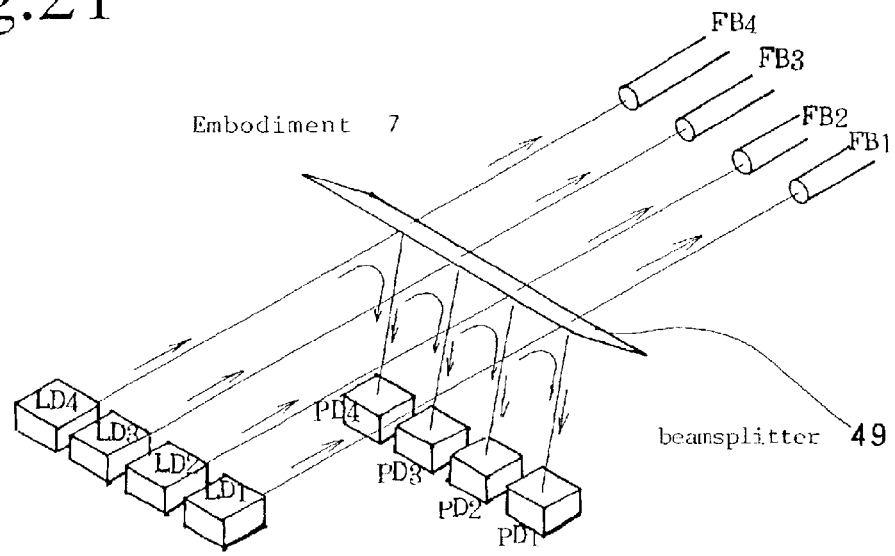
FIG. 21 is a schematic perspective view of Embodiment 7 for clarifying light paths being divided by a beamsplitter and joining fibers, monitoring PDs and LDs. The downward slanting beamsplitter reflects beams from the LDs downward to the monitoring PDs and allows the rest of the LD beams to pass through to the fibers.

FIG. 21, which depicts a case of M=4, shows beam divisions by the beamsplitter 49. Embodiment 7 which poses the monitoring PDs on the lower case installs the beamsplitter slanting downward. Unlike Embodiments 1 and 2, Embodiment 7 is not an LD/PD module but an LD module. No signal light goes into the module from optical fibers (FB1 to FB4).

The LD beams emitted from LDs (LD1 to LD4) are partially reflected by the downward slanting beamsplitter 49, enter the monitoring PDs 79 (PD1 to PD4) in the lower case, and induce photocurrents which are in proportion to the power levels of the LDs. The rest of the LD light pass through the beamsplitter 49, go into the optical fibers and propagates in external fibers to a counterpart node. In comparison to FIG. 19 of Embodiment 2 of the lower PD type, the slanting direction of the beamsplitter 49 (FIG. 21; Embodiment 7) is inverse to the direction of the WDM 68 (FIG. 19; Embodiment 2). The beamsplitter 49 faces toward the LDs 1 to 4 for reflecting the LD beams toward the lower monitoring PDs in Embodiment 7. On the contrary, the WDM 68 faces toward the inlet fibers for reflecting all the receiving signals from the fibers toward the signal detecting PDs. With regard to the LD light beams, Embodiment 7 reflects a part of the LD beams by the beamsplitter 49 and allows the rest of the LD beams to pass, but Embodiment 2 allows all the LD beams to pass the WDM 68.

Like the LD/PD module of Embodiment 2, a lower case 70 of Embodiment 7 is a top-opening case having a front wall 73, a rear wall 72, a bottom floor 75 and side walls 74. The lower case 70 is insert-molded with a leadframe and a resin in a metallic mold. The lower case has a bottom leadframe 80 with wiring patterns. The figure depicts a uniform thick leadframe 80 in brief. But, in practice, many curves, notches, lines and pads are included in the leadframe. M monitoring PDs 79 and APC-ICs which control driving currents of the LDs 8 for stabilizing the driving currents of the LDs are mounted upon the leadframe 80 in the lower case 70. The monitoring PDs 79 are either a bottom incidence type which is upside down fitted or a top incidence type which is upside up fitted on the leadframe.

A wire 82 connects the monitoring PD 79 to the APC-IC 69. The APC-IC 69 is connected to the LD 8 via the leadframes within or out of the cases. A part of the transmitting beams reflected by the beamsplitter 49 goes into the monitoring PD 79 and generates photocurrents. The photocurrents, which are in proportion to the power levels of the LDs 8, are introduced into the APC-ICs 69. The APC-IC maintains the power levels of the LD by controlling the driving currents.

Both the upper case 50 and the lower case 70 are filled with a transparent resin 40. The unified cases are further transfermolded with an epoxy resin which is an opaque and rigid resin. Such a structure is similar to Embodiment 1.

What is claimed is:

1. An optical communications module comprising:
   M photodiodes (PDs) for receiving transmitted optical signals wherein M>=1;
   an insulating, opaque upper case with floor holes for holding the M photodiodes;
   a bench;
   M lightwaveguides formed in parallel on the bench;
   M laser diodes (LDs) mounted at ends of the M lightwaveguides for generating transmitting optical signals;
   a wavelength division multiplexer (WDM) filter slantingly mounted midway in the M lightwaveguides on the bench;
   an optical connector;
   M optical fibers connected to the M lightwaveguides at M ends and held in the optical connector; and
   an insulating lower case supporting the optical connector and the bench with the m lightwaveguides and the m laser diodes (lds) in series and being unified with the upper case in a vertical direction,
   the WDM filter allowing the transmitting optical signals being emitted from the M LDs and propagating in the M lightwaveguides to pass through to the M optical fibers in the lower case and reflecting the receiving optical signals propagating from the M optical fibers slantingly upward via the floor holes to the M photodiodes in the upper case.

2. An optical communications module according to claim 1, wherein the upper case and the lower case are filled with a transparent resin.

3. An optical communications module according to claim 1, wherein electric wirings of the MPDs and electric wirings of the MLDs are formed on different cases and are separated and isolated from each other.

4. An optical communications module according to claim 1, wherein M preamplifiers (AMPs) are mounted near the M PDs and the M AMPs are connected by M wires to the M PDs on the upper case for preamplifying M photocurrents of the M PDs.

5. An optical communications module according to claim 4, wherein M is larger than one (M≧2) and the wires connecting the M PDs to the M AMPs are vertical to each other.

6. An optical communications module according to claim 1, wherein the upper case and the lower case are made by insert-molding a resin with a leadframe in a metallic mould.

7. An optical communications module according to claim 1, wherein the upper case and the lower case are ceramic cases with printed wirings and brazed leadpins.

8. An optical communications module according to claim 1, wherein the bench is a silicon single crystal bench.

9. An optical communications module according to claim 1, wherein the bench is a glass bench.

10. An optical communications module according to claim 1, wherein the bench is a ceramic bench.

11. An optical communications module according to claim 1, wherein the bench is a polymer bench.

12. An optical communications module according to claim 1, wherein the M lightwaveguides are made from a polymer.

13. An optical communications module according to claim 1, wherein the M lightwaveguides are made from quartz.

14. An optical communications module comprising:
    a bench;
    M lightwaveguides formed in parallel on the bench wherein M>=1;
    M laser diodes (LDs) mounted at ends of the M lightwaveguides for generating transmitting optical signals;
    a wavelength division multiplexer (WDM) filter slantingly mounted midway in the M lightwaveguides on the bench;
    an optical connector;
    M optical fibers connected to the M lightwaveguides at M ends and held in the optical connector;
    an insulating, opaque upper case with floor holes supporting the optical connector and the bench with the M lightwaveguides and the M laser diodes (LDs) in series;
    M photodiodes (PDs) for receiving transmitted optical signals; and
    an insulating lower case holding the M photodiodes and being unified with the upper case in a vertical direction,
    the WDM filter allowing the transmitting optical signals being emitted from the M LDs and propagating in the M lightwaveguides to pass through to the M optical fibers in the upper case and the reflecting receiving optical signals propagating from the M optical fibers slantingly downward via the floor holes to the M photodiodes in the lower case.

15. An optical communications module according to claim 14, wherein the upper case and the lower case are filled with a transparent resin.

16. An optical communications module according to claim 14, wherein electric wirings of the M PDs and electric wirings of the M LDs are formed on different cases and are separated and isolated from each other.

17. An optical communications module according to claim 14, wherein M preamplifiers (AMPs) are mounted near the M PDs and the M AMPs are connected by M wires to the M PDs on the lower case for preamplifying M photocurrents of the M PDs.

18. An optical communications module according to claim 17, wherein M is larger than one (M≧2) and the wires connecting the M PDs to the M AMPs are vertical to each other.

19. An optical communications module according to claim 14, wherein the upper case and the lower case are made by insert-molding a resin with a leadframe in a metallic mould.

20. An optical communications module according to claim 14, wherein the upper case and the lower case are ceramic cases with printed wirings and brazed leadpins.

21. An optical communications module according to claim 14, wherein the bench is a silicon single crystal bench.

22. An optical communications module according to claim 14, wherein the bench is a glass bench.

23. An optical communications module according to claim 14, wherein the bench is a ceramic bench.

24. An optical communications module according to claim 14, wherein the bench is a polymer bench.

25. An optical communications module according to claim 14, wherein the M lightwaveguides are made from a polymer.

26. An optical communications module according to claim 14, wherein the M lightwaveguides are made from quartz.

27. An optical communications module comprising:
M monitoring photodiodes (PDs) for monitoring transmitting optical signals wherein M>=1;
an insulating, opaque upper case with floor holes for holding the M monitoring photodiodes;
a bench;
M lightwaveguides formed in parallel on the bench;
M laser diodes (LDs) mounted at ends of the M lightwaveguides for generating transmitting optical signals;
a beamsplitter slantingly mounted midway in the M lightwaveguides on the bench;
an optical connector;
M optical fibers connected to the M lightwaveguides at M ends and held in the optical connector; and
an insulating lower case supporting the optical connector and the bench with the M lightwaveguides and the M laser diodes (LDs) in series and being unified with the upper case in a vertical direction,
the beamsplitter partially allowing the transmitting optical signals being emitted from the M LDs and propagating in the M lightwaveguides to pass through to the M optical fibers in the lower case and partially reflecting the transmitting optical signals emitted from the M LDs slantingly upward via the floor holes to the M monitoring photodiodes in the upper case.

28. An optical communications module according to claim 27, wherein the upper case and the lower case are filled with a transparent resin.

29. An optical communications module according to claim 27, wherein electric wirings of the M monitoring PDs and electric wirings of the M LDs are formed on different cases and are separated and isolated from each other.

30. An optical communications module according to claim 27, wherein the upper case and the lower case are made by insert-molding a resin with a leadframe in a metallic mould.

31. An optical communications module according to claim 27, wherein the upper case and the lower case are ceramic cases with printed wirings and brazed leadpins.

32. An optical communications module according to claim 27, wherein the bench is a silicon single crystal bench.

33. An optical communications module according to claim 27, wherein the bench is a glass bench.

34. An optical communications module according to claim 27, wherein the bench is a ceramic bench.

35. An optical communications module according to claim 27, wherein the bench is a polymer bench.

36. An optical communications module according to claim 27, wherein the M lightwaveguides are made from a polymer.

37. An optical communications module according to claim 27, wherein the M lightwaveguides are made from quartz.

38. An optical communications module according to claim 27, wherein M auto-power controlling ICs (APC-ICs) are mounted near the M monitoring PDs and the M APC-ICs are connected by M wires to the M monitoring PDs on the upper case for controlling driving currents of the M LDs which are detected by the M monitoring PDs.

39. An optical communications module according to claim 38, wherein M is larger than one (M≧2) and the wires connecting the M monitoring PDs to the M APC-ICs are vertical to each other.

40. An optical communications module comprising:
a bench;
M lightwaveguides formed in parallel on the bench wherein M>=1;
M laser diodes (LDs) mounted at ends of the M lightwaveguides for generating transmitting optical signals;
a beamsplitter slantingly mounted midway in the M lightwaveguides on the bench;
an optical connector;
M optical fibers connected to the M lightwaveguides at M ends and held in the optical connector;
an insulating, opaque upper case with floor holes supporting the optical connector and the bench with the M lightwaveguides and the M laser diodes (LDs) in series;
M monitoring photodiodes (PDs) for monitoring the transmitting optical signals emitted from the M LDs; and
an insulating lower case holding the M monitoring photodiodes and being unified with the upper case in a vertical direction,
the beamsplitter partially allowing the transmitting optical signals being emitted from the M LDs and propagating in the M lightwaveguides to pass through to the M optical fibers in the upper case and partially reflecting the transmitting optical signals being emitted from the M LDs and propagating in the M lightwaveguides slantingly downward via the floor holes to the M monitoring photodiodes in the lower case.

41. An optical communications module according to claim 40, wherein the upper case and the lower case are filled with a transparent resin.

42. An optical communications module according to claim 40, wherein electric wirings of the M monitoring PDs and electric wirings of the M LDs are formed on different cases and are separated and isolated from each other.

43. An optical communications module according to claim 40, wherein the upper case and the lower case are made by insert-molding a resin with a leadframe in a metallic mould.

44. An optical communications module according to claim 40, wherein the upper case and the lower case are ceramic cases with printed wirings and brazed leadpins.

45. An optical communications module according to claim 40, wherein the bench is a silicon single crystal bench.

46. An optical communications module according to claim 40, wherein the bench is a glass bench.

47. An optical communications module according to claim 40, wherein the bench is a ceramic bench.

48. An optical communications module according to claim 40, wherein the bench is a polymer bench.

49. An optical communications module according to claim 40, wherein the M lightwaveguides are made from a polymer.

50. An optical communications module according to claim 40, wherein the M lightwaveguides are made from quartz.

51. An optical communications module according to claim 40, wherein M auto-power controlling ICs (APC-ICs) are mounted near the M monitoring PDs and the M APC-ICs are connected by M wires to the M monitoring PDs on the lower case for controlling driving currents of the M LDs which are detected by the M monitoring PDs.

52. An optical communications module according to claim 51, wherein M is larger than one ($M \geq 2$) and the wires connecting the M monitoring PDs to the M APC-ICs are vertical to each other.

* * * * *